United States Patent
Wu et al.

(10) Patent No.: US 10,727,236 B2
(45) Date of Patent: Jul. 28, 2020

(54) CIRCUITS CONSTRUCTED FROM STACKED FIELD-EFFECT TRANSISTORS

(71) Applicant: GLOBALFOUNDRIES Inc., Grand Cayman (KY)

(72) Inventors: Nan Wu, Sachsen (DE); Peter Baars, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/229,600

(22) Filed: Dec. 21, 2018

(65) Prior Publication Data

US 2020/0203355 A1  Jun. 25, 2020

(51) Int. Cl.
  *H01L 27/11* (2006.01)
  *H01L 27/088* (2006.01)
  *G11C 11/412* (2006.01)

(52) U.S. Cl.
  CPC ........ *H01L 27/1104* (2013.01); *G11C 11/412* (2013.01); *H01L 27/0886* (2013.01)

(58) Field of Classification Search
  None
  See application file for complete search history.

(56) References Cited

U.S. PATENT DOCUMENTS

| | | |
|---|---|---|
| 5,528,177 A | 6/1996 | Sridhar et al. |
| 8,294,511 B2 | 10/2012 | Juengling |
| 9,755,071 B1 | 9/2017 | Anderson et al. |
| 9,842,843 B2 | 12/2017 | Liaw |
| 2009/0014806 A1* | 1/2009 | Ostermayr ...... H01L 21/823807 257/369 |
| 2013/0175627 A1* | 7/2013 | Goldbach ........... H01L 27/0207 257/350 |
| 2016/0336421 A1* | 11/2016 | Cheng ................ H01L 27/0924 |
| 2017/0141113 A1* | 5/2017 | Sagong .............. H01L 27/0922 |

OTHER PUBLICATIONS

Nan Wu, "Circuits Constructed From Stacked Field-Effect Transistors", filed Mar. 15, 2018 as U.S. Appl. No. 15/922,321.
Loubet et al., "Stacked Nanosheet Gate-All-Around Transistor to Enable Scaling Beyond FinFET", 2017 Symposium on VLSI Technology Digest of Technical Papers.

(Continued)

*Primary Examiner* — Herve-Louis Y Assouman
(74) *Attorney, Agent, or Firm* — Thompson Hine LLP; Francois Pagette

(57) ABSTRACT

Structures that include stacked field-effect transistors and methods for forming a structure that includes stacked field-effect transistors. A structure includes a first fin, a second fin arranged over the first fin, a first dielectric layer between the first fin and the second fin, and a first inverter. The first inverter includes a first field-effect transistor with a channel region in the first fin and a second field-effect transistor with a channel region in the second fin. The first field-effect transistor and the second field-effect transistor share a first gate structure having an overlapping arrangement with the channel region in the first fin and the channel region in the second fin. The first fin has a longitudinal axis, and the second fin has a longitudinal axis that is aligned at an angle relative to the longitudinal axis of the first fin.

17 Claims, 30 Drawing Sheets

(56) References Cited

OTHER PUBLICATIONS

3DIC.org, "Cool Cube" retrieved from the internet on Mar. 15, 2018 at www.3dic.org/CoolCube.
V. Deshpande et al., "First demonstration of 3D SRAM through 3D monolithic integration of InGaAs n-FinFETs on FDSOI Si CMOS with inter-layer contacts," 2017 Symposium on VLSI Technology, Kyoto, 2017, pp. T74-T75.
Gary Hilson, "Leti Tweaks SRAM to Improve SoC Memory", EE Times, Dec. 15, 2017.

* cited by examiner

CIRCUITS CONSTRUCTED FROM STACKED FIELD-EFFECT TRANSISTORS

BACKGROUND

The present invention relates to semiconductor device fabrication and integrated circuits and, more specifically, to structures that include stacked field-effect transistors and methods for forming a structure that includes stacked field-effect transistors.

Static random access memory (SRAM) may be used, for example, to temporarily store data in a computer system. When continuously powered, the memory state of an SRAM persists without the need for data refresh operations. An SRAM device includes an array of bitcells in which each bitcell retains a single bit of data during operation. Each SRAM bitcell may include a pair of cross-coupled inverters and a pair of access transistors connecting the inverters to complementary bit lines. The two access transistors are controlled by word lines, which are used to select the SRAM bitcell for read or write operations.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate associated with their formation. Planar field-effect transistors and fin-type field-effect transistors constitute a category of transistor structures in which the flow of gated current in the channel is oriented in a horizontal direction parallel to the substrate surface.

Improved structures that include stacked field-effect transistors and methods for forming a structure that includes stacked field-effect transistors are needed.

SUMMARY

In an embodiment, a structure is provided for a static random access memory device. The structure includes a bitcell having a first fin, a second fin arranged over the first fin, a first dielectric layer between the first fin and the second fin, and a first inverter. The first inverter includes a first field-effect transistor with a channel region in the first fin and a second field-effect transistor with a channel region in the second fin. The first field-effect transistor and the second field-effect transistor share a first gate structure having an overlapping arrangement with the channel region in the first fin and the channel region in the second fin. The first fin has a longitudinal axis, and the second fin has a longitudinal axis that is aligned at an angle relative to the longitudinal axis of the first fin.

In an embodiment, a structure includes a first field-effect transistor having a first fin, a first source/drain region, and a second source/drain region, and a second field-effect transistor having a second fin arranged under the first fin, a third source/drain region, and a fourth source/drain region. A gate structure is shared by the first field-effect transistor and the second field-effect transistor. The gate structure has a first overlapping arrangement with a section of the first fin and a second overlapping arrangement with a section of the second fin. The first fin includes a portion of a device layer of a semiconductor-on-insulator substrate, and the second fin includes a portion of a substrate of the semiconductor-on-insulator substrate.

In an embodiment, a method includes patterning a device layer and a substrate of a semiconductor-on-insulator substrate to respectively define a first fin and a second fin arranged under the first fin, epitaxially growing a first semiconductor material from the first fin, and patterning the first semiconductor material and the first fin to form a first source/drain region and a second source drain region having a linear arrangement with a section of the first fin. The first semiconductor material and the first fin are patterned such that the linear arrangement has a longitudinal axis that is aligned at an angle relative to a longitudinal axis of the second fin.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
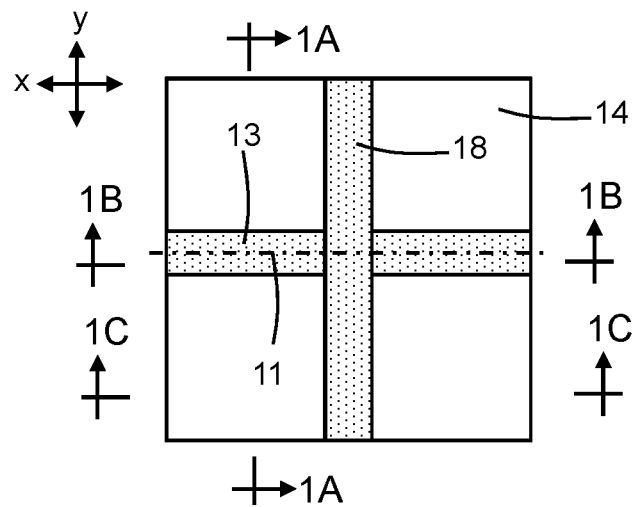
FIG. 1 is a top view of a structure at an initial fabrication stage of a processing method in accordance with embodiments of the invention.
Figure 1A:
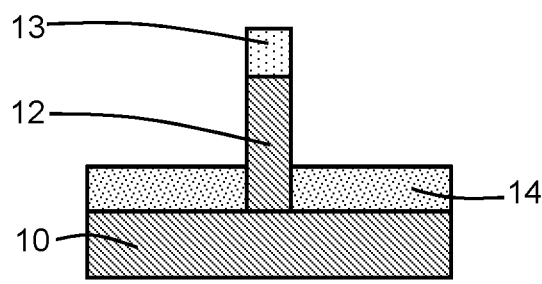
FIG. 1A is a cross-sectional view taken generally along line 1A-1A in FIG. 1.
Figure 1B:
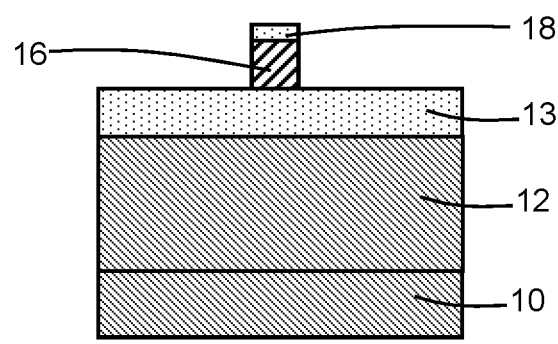
FIG. 1B is a cross-sectional view taken generally along line 1B-1B in FIG. 1.
Figure 1C:
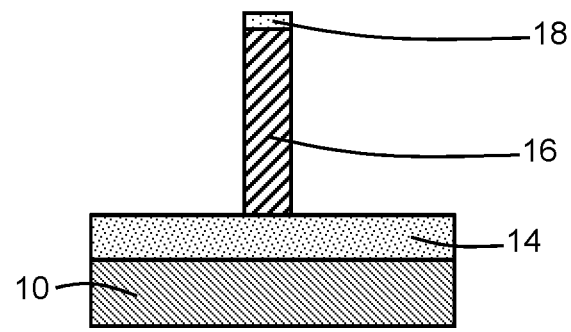
FIG. 1C is a cross-sectional view taken generally along line 1C-1C in FIG. 1.

With reference to FIGS. 1, 1A, 1B, 1C and in accordance with embodiments of the invention, a fin 12 projects in a vertical direction from a substrate 10. The fin 12 may be formed from semiconductor material, such as the semiconductor material of the substrate 10, that is patterned using photolithography and etching processes, and cut into given lengths in the layout. The fin 12 may include a cap 13 formed as part of the patterning process. The cap 13 may be composed of one or more dielectric materials. The substrate 10 may be composed of a single crystal semiconductor material (e.g., single-crystal silicon), and may be either a bulk semiconductor substrate or a device layer of a silicon-on-insulator wafer. The fin 12 extends along a longitudinal axis 11 along its length, which may be aligned in the x-direction of an x-y coordinate frame.

A dielectric layer 14 is arranged over the substrate 10 and surrounds the fin 12 as shallow trench isolation. The dielectric layer 14 may be composed of a dielectric material, such as silicon nitride, that is deposited by chemical vapor deposition (CVD) and recessed with an etching process. The fin 12 extends in a vertical direction through the thickness of the dielectric layer 14 and has an active section that protrudes above the dielectric layer 14.

A sacrificial gate structure 16 is formed that extends across the fin 12 and onto the dielectric layer 14 adjacent to the fin 12. The sacrificial gate structure 16 may extend in a direction along its length, which may be aligned in the y-direction of the x-y coordinate frame, that is orthogonal to the longitudinal axis 11 along which the fin 12 extends. The sacrificial gate structure 16 may be a placeholder for a gate structure that is formed in a subsequent processing stage. The formation of the sacrificial gate structure 16 may include depositing a blanket layer of a sacrificial material, such as amorphous silicon or polysilicon by chemical vapor deposition, and patterning the deposited blanket layer using sections of a hardmask as an etch mask and an etching process, such as reactive ion etching (RIE). The sacrificial gate structure 16 may be covered by a cap 18 representing a hardmask section that remains after patterning.

With reference to FIGS. 2, 2A, 2B, 2C in which like reference numerals refer to like features in FIGS. 1, 1A, 1B, 1C and at a subsequent fabrication stage of the processing method, sidewall spacers 20 are formed adjacent to the sidewalls of the sacrificial gate structure 16. The sidewall spacers 20 may be composed of a dielectric material, such as silicon nitride or a low-k dielectric material having a dielectric constant (i.e., permittivity) that is less than the dielectric constant of silicon nitride. The sidewall spacers 20 may be formed by depositing a conformal layer by atomic layer deposition and etching with an etching process, such as reactive ion etching.

Source/drain regions 21, 22 are formed by an epitaxial growth process on portions of the fin 12 that are arranged on opposite sides of the sacrificial gate structure 16 and above the dielectric layer 14. The source/drain regions 21, 22 extend along the length of the fin 12. The cap 13 prohibits epitaxial growth from the top surface of the fin 12, and the cap 18 and sidewall spacers 20 prohibit epitaxial growth from the sacrificial gate structure 16. In an embodiment, the source/drain regions 21, 22 may be formed by selective epitaxial growth (SEG) process in which the constituent semiconductor material nucleates for epitaxial growth on semiconductor surfaces (e.g., fin 12), but does not nucleate for epitaxial growth from insulator surfaces (e.g., cap 13, cap 18, and sidewall spacers 20). The source/drain regions 21, 22 may be sections of epitaxially-grown semiconductor material containing a concentration of an n-type dopant (e.g., phosphorus and/or arsenic) that provides n-type electrical conductivity. Alternatively, the source/drain regions 21, 22 may be sections of epitaxially-grown semiconductor material containing a concentration of a p-type dopant (e.g., boron, aluminum, gallium, and/or indium) that provides p-type electrical conductivity.

Figure 2:
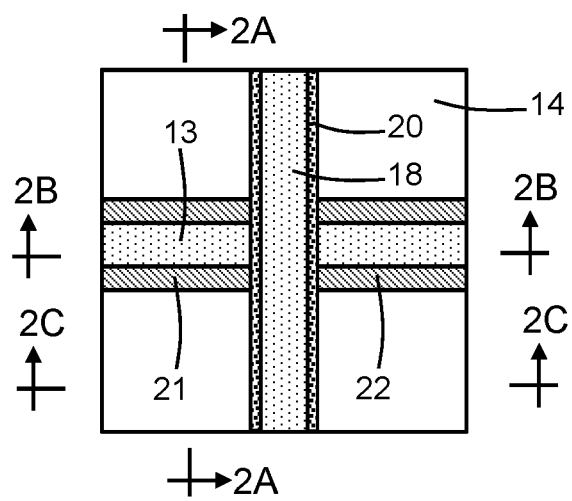
FIG. 2 is a top view showing a structure at a fabrication stage of the processing method subsequent to the fabrication stage of FIG. 1.
Figure 2A:
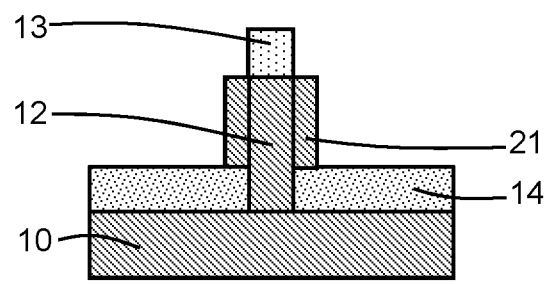
FIG. 2A is a cross-sectional view taken generally along line 2A-2A in FIG. 2.
Figure 2B:
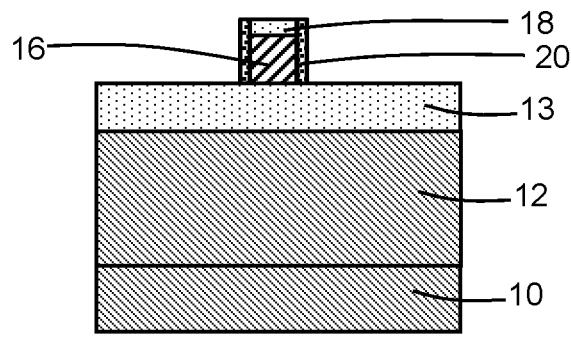
FIG. 2B is a cross-sectional view taken generally along line 2B-2B in FIG. 2.
Figure 2C:
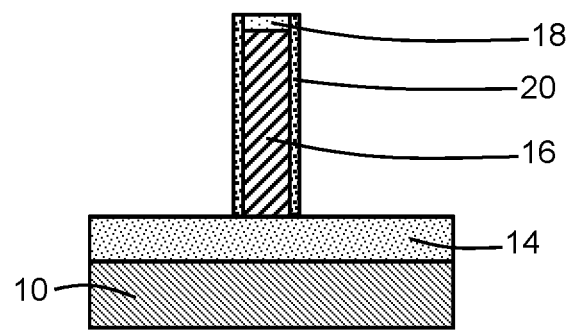
FIG. 2C is a cross-sectional view taken generally along line 2C-2C in FIG. 2.
Figure 3A:
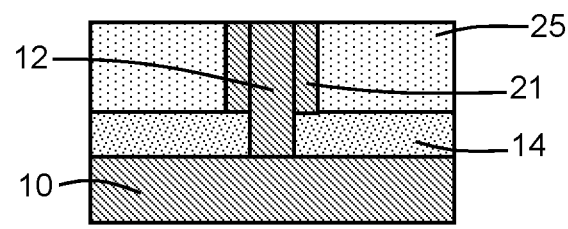
FIGS. 3A, 3B, 3C are cross-sectional views of the structure at a fabrication stage of the processing method subsequent to FIGS. 2A, 2B, 2C.
Figure 3B:
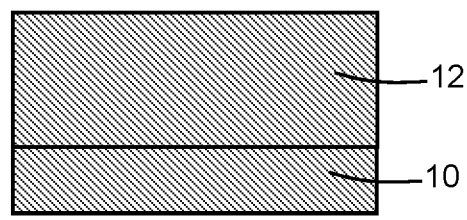
Figure 3C:
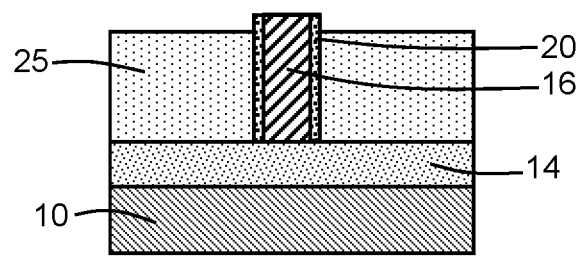

With reference to FIGS. 3A, 3B, 3C in which like reference numerals refer to like features in FIGS. 2A, 2B, 2C and at a subsequent fabrication stage of the processing method, a dielectric layer 25 is formed over the fin 12, source/drain regions 21, 22, and sacrificial gate structure 16 after the source/drain regions 21, 22 are epitaxially grown. The dielectric layer 25 may be composed of a dielectric material, such as silicon dioxide, deposited by a chemical vapor deposition process and planarized by chemical mechanical polishing (CMP) to have a top surface that is coplanar with the cap 18 on the sacrificial gate structure 16. The dielectric layer 25 is further planarized by chemical mechanical polishing to be coplanar with the cap 13 on the fin 12, which removes the cap 18 from the sacrificial gate structure 16 and reduces the height of the sacrificial gate structure 16. The cap 13 is removed from the fin 12 by an etching process. The etching process used to remove the cap 13 may further recess the dielectric layer 25.

Figure 4A:
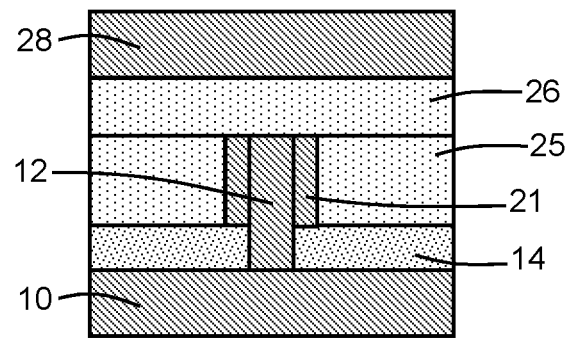
FIGS. 4A, 4B, 4C are cross-sectional views of the structure at a fabrication stage of the processing method subsequent to FIGS. 3A, 3C, 3C.
Figure 4B:
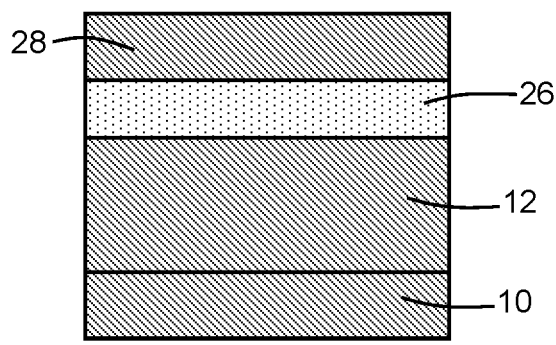
Figure 4C:
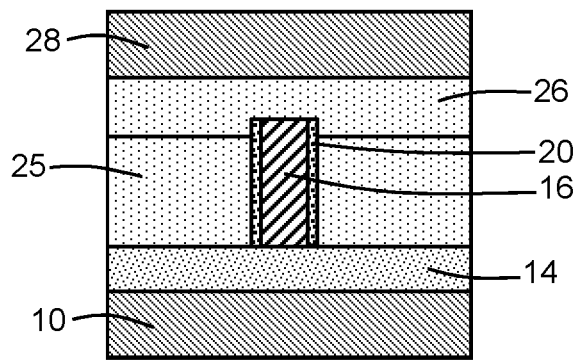
Figure 5:
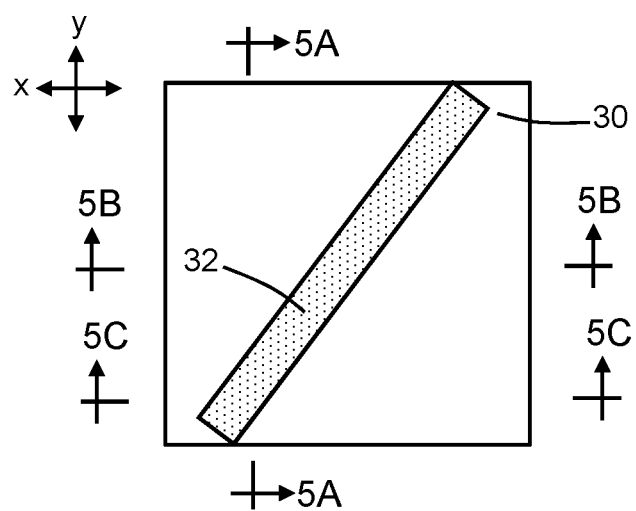
FIG. 5 is a top view showing a structure at a fabrication stage of the processing method subsequent to the fabrication stage of FIGS. 4A, 4B, 4C.
Figure 5A:
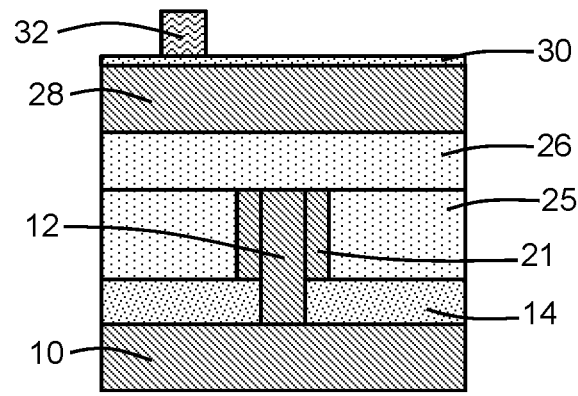
FIG. 5A is a cross-sectional view taken generally along line 5A-5A in FIG. 5.
Figure 5B:
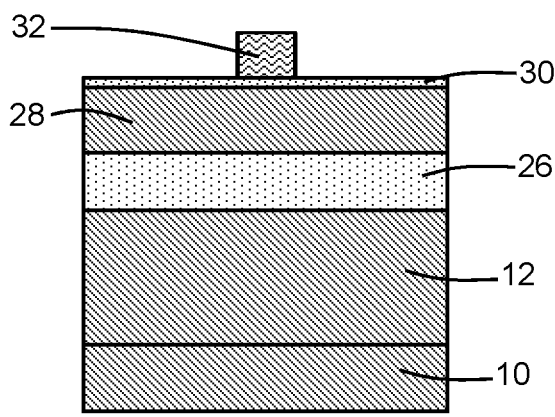
FIG. 5B is a cross-sectional view taken generally along line 5B-5B in FIG. 5.
Figure 5C:
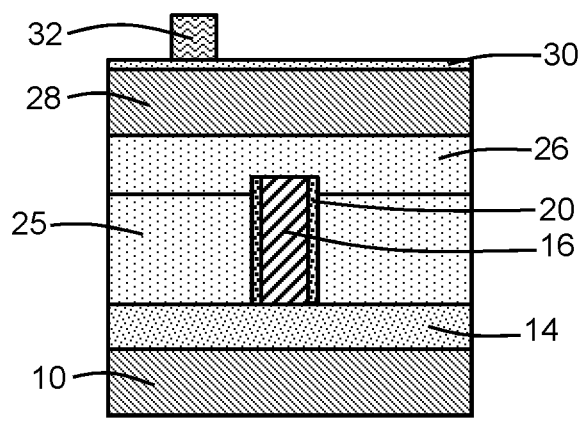
FIG. 5C is a cross-sectional view taken generally along line 5C-5C in FIG. 5.

With reference to FIGS. 4A, 4B, 4C in which like reference numerals refer to like features in FIGS. 3A, 3B, 3C and at a subsequent fabrication stage of the processing method, a dielectric layer 26 is formed over the fin 12, source/drain regions 21, 22, and sacrificial gate structure 16. The dielectric layer 26 may be composed of a dielectric material, such as silicon dioxide, deposited by chemical vapor deposition and planarized by chemical mechanical polishing to have a planar top surface.

A semiconductor layer 28 representing a device layer of a silicon-on-insulator substrate may be transferred from the silicon-on-insulator substrate and bonded to the top surface of the dielectric layer 26. The handle wafer and buried oxide layer of the silicon-on-insulator substrate may be removed by grinding, polishing, and/etching from the back side opposite to the front side that is attached by bonding to the dielectric layer 26.

With reference to FIGS. 5, 5A, 5B, 5C in which like reference numerals refer to like features in FIGS. 4A, 4B, 4C and at a subsequent fabrication stage of the processing method, a dielectric layer 30 is formed on the semiconductor layer 28 and an etch mask 32 is formed by lithography over the dielectric layer 30. The dielectric layer 30 may be composed of a dielectric material, such as silicon dioxide, deposited by chemical vapor deposition. The etch mask 32 may be comprised of a layer of a light-sensitive material, such as an organic photoresist, applied by a spin coating process, pre-baked, exposed to light projected through a photomask, baked after exposure, and developed with a chemical developer. The etch mask 32 may also include an anti-reflective coating and a spin-on hardmask, such as an organic planarization layer (OPL), that are patterned along with the photoresist. The etch mask 32 covers a strip of the semiconductor layer 28 having a longitudinal axis that is inclined at an angle (i.e., rotated) relative to a longitudinal axis 11 extending along the length of the fin 12.

With reference to FIGS. 6, 6A, 6B, 6C in which like reference numerals refer to like features in FIGS. 5, 5A, 5B, 5C and at a subsequent fabrication stage of the processing method, an etching process, such as reactive ion etching, is used to pattern the dielectric layer 30, the semiconductor layer 28, and the dielectric layer 26. The patterning of the semiconductor layer 28 defines a fin 34 over an area of the semiconductor layer 28 that is masked and protected by the etch mask 32. A residual patterned section of the dielectric layer 30 is arranged as a cap on the fin 34, and a residual patterned section of the dielectric layer 26 is arranged between the fin 34 and the fin 12. The etch mask 32 is stripped following the conclusion of the etching process forming the fin 34.

The fin 34 has a longitudinal axis 33 that is rotated or inclined at an angle, θ, in the x-y plane relative to the longitudinal axis of the sacrificial gate structure 16 and at a complementary angle in the x-y plane relative to the longitudinal axis 11 of the fin 12. The inclination of the fin 34 relative to the fin 12 is established by the alignment during lithography of the etch mask 32 relative to the fin 12. Generally, the fin 34 is arranged over the fin 12 in an upper level of the structure and is aligned and rotated to extend across the fin 12 in a lower level of the structure with a vertical displacement to provide an overlap and vertically-displaced intersection (i.e., overlap in a vertical direction) between the fins 12 and 34. Different portions of the fin 34 are arranged on opposite sides of the fin 12 and, similarly, different portions of the fin 12 are arranged on opposite sides of the fin 34. The overlap between the fins 12, 34 facilitates the formation of a single gate structure that is shared between the lower field-effect transistor formed from fin 12 and the upper field-effect transistor formed from fin 34.

Figure 6:
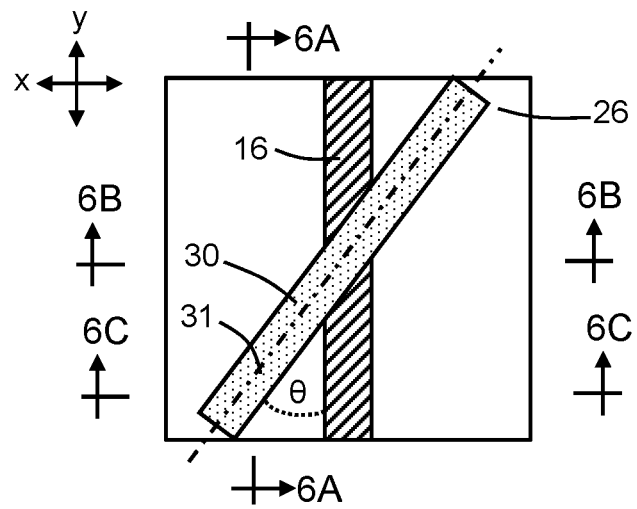
FIG. 6 is a top view of the structure at a fabrication stage of the processing method subsequent to the fabrication stage of FIG. 5.
Figure 6A:
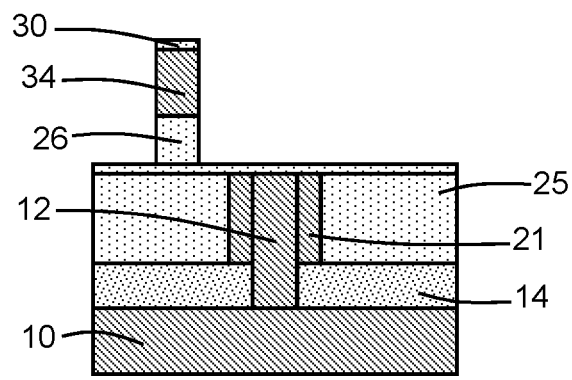
FIG. 6A is a cross-sectional view taken generally along line 6A-6A in FIG. 6.
Figure 6B:
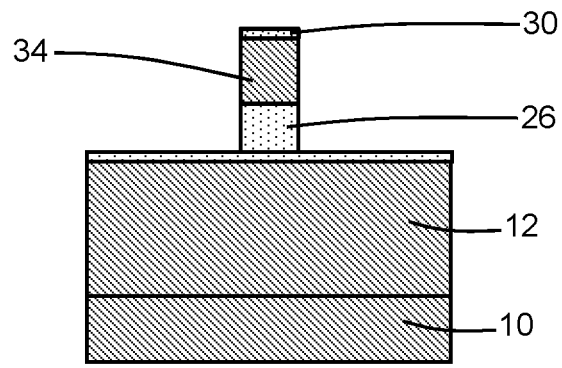
FIG. 6B is a cross-sectional view taken generally along line 6B-6B in FIG. 6.
Figure 6C:
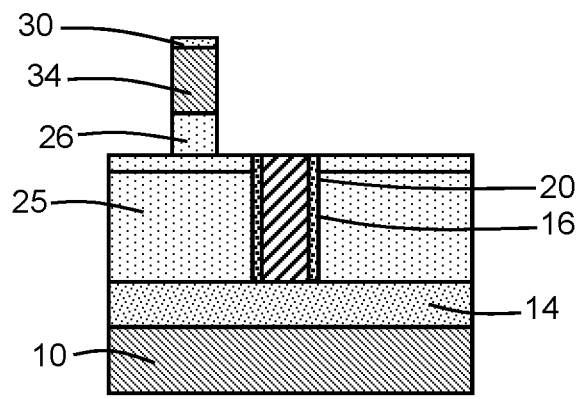
FIG. 6C is a cross-sectional view taken generally along line 6C-6C in FIG. 6.
Figure 7A:
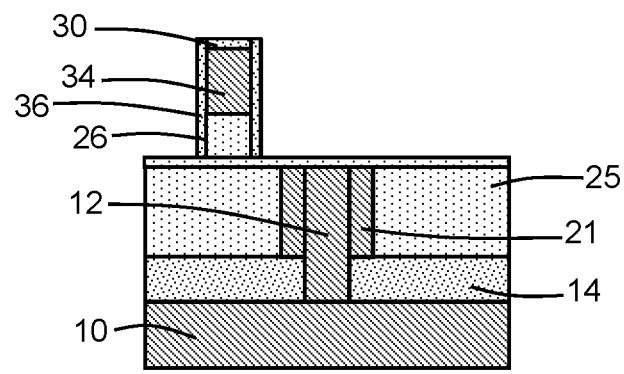
FIGS. 7A, 7B, 7C are cross-sectional views of the structure at a fabrication stage of the processing method subsequent to FIGS. 6A, 6B, 6C.
Figure 7B:
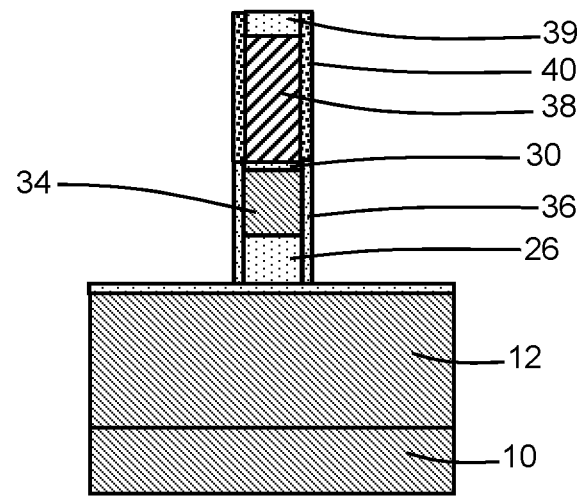
Figure 7C:
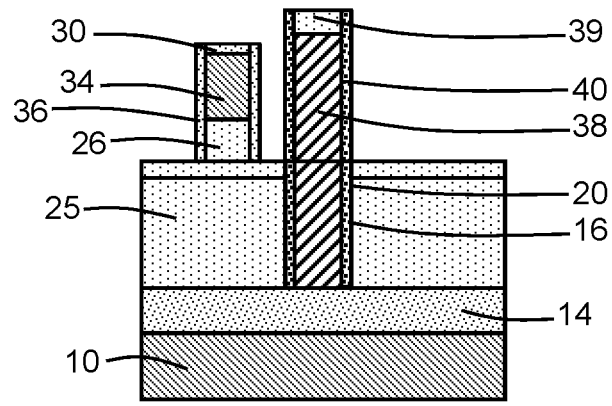

With reference to FIGS. 7A, 7B, 7C in which like reference numerals refer to like features in FIGS. 6A, 6B, 6C and at a subsequent fabrication stage of the processing method, sidewall spacers 36 are formed at the sidewalls of the fin 34. The sidewall spacers 36 may be composed of a dielectric material, such as silicon dioxide, that is deposited as a conformal layer by, for example, atomic layer deposition (ALD) and then etched with an etching process, such as reactive ion etching.

A sacrificial gate structure 38 is formed by lithography and etching as another placeholder for a gate structure that is formed in a subsequent fabrication stage. The sacrificial gate structure 38 extends across the fin 34 and onto the dielectric layer 30. The sacrificial gate structure 38 is aligned with the sacrificial gate structure 16 such that the sacrificial gate structure 16 and the sacrificial gate structure 38 form a continuous vertical pillar. The formation of the sacrificial gate structure 38 may include depositing a blanket layer of a sacrificial material, such as amorphous silicon or polysilicon by chemical vapor deposition, and patterning this layer using sections of a hardmask as an etch mask and an anisotropic etching process, such as reactive ion etching.

The sacrificial gate structure 38 may be covered by a cap 39 representing a hardmask section that remains after patterning.

Sidewall spacers 40 are formed adjacent to the sidewalls of the sacrificial gate structure 38. The sidewall spacers 40 are aligned with the sidewall spacers 20 due to the alignment of the sacrificial gate structures 16, 38. The sidewall spacers 40 may be composed of a dielectric material, such as silicon nitride or a low-k dielectric material having a dielectric constant (i.e., permittivity) less than the dielectric constant of silicon nitride. The sidewall spacers 40 may be formed by depositing a conformal layer by atomic layer deposition and etching with an etching process, such as reactive ion etching.

With reference to FIGS. 8, 8A, 8B, 8C in which like reference numerals refer to like features in FIGS. 7A, 7B, 7C and at a subsequent fabrication stage of the processing method, the sidewall spacers 36 are removed from the sidewalls of the fin 34 by, for example, an etching process. Source/drain regions 42, 43 are formed by an epitaxial growth process on the fin 12 arranged on opposite sides of the sacrificial gate structure 16 and above the dielectric layer 14. The cap 39 prevents epitaxial growth from the top surface of the fin 34, and the cap 39 and sidewall spacers 40 prohibit epitaxial growth from the sacrificial gate structure 38. In an embodiment, the source/drain regions 42, 43 may be formed by selective epitaxial growth (SEG) process in which the constituent semiconductor material nucleates for epitaxial growth on semiconductor surfaces (e.g., fin 34), but does not nucleate for epitaxial growth from insulator surfaces (e.g., cap 39 and sidewall spacers 40).

The source/drain regions 42, 43 are doped to have an opposite conductivity type from the source/drain regions 21, 22. If the source/drain regions 21, 22 are composed of semiconductor material with p-type electrical conductivity, the source/drain regions 42, 43 may be sections of epitaxially-grown semiconductor material containing a concentration of an n-type dopant (e.g., phosphorus and/or arsenic) that provides n-type electrical conductivity. Alternatively, if the source/drain regions 21, 22 are composed of semiconductor material with n-type electrical conductivity, the source/drain regions 42, 43 may be sections of epitaxially-grown semiconductor material containing a concentration of a p-type dopant (e.g., boron, aluminum, gallium, and/or indium) that provides p-type electrical conductivity.

Figure 8:
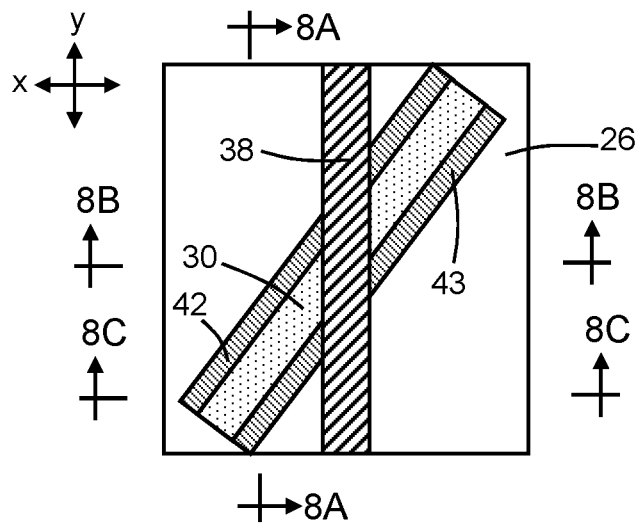
FIG. 8 is a top view of the structure at a fabrication stage of the processing method subsequent to the fabrication stage of FIGS. 7A, 7B, 7C.
Figure 8A:
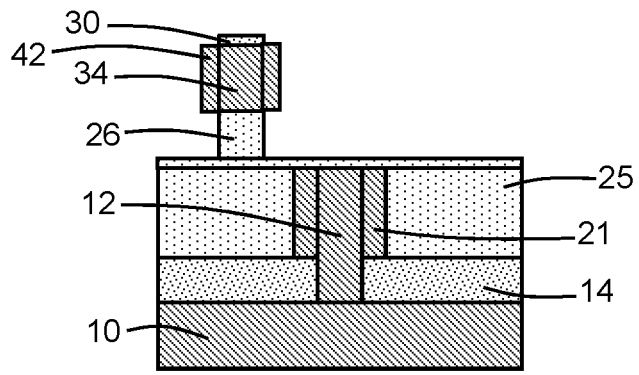
FIG. 8A is a cross-sectional view taken generally along line 8A-8A in FIG. 8.
Figure 8B:
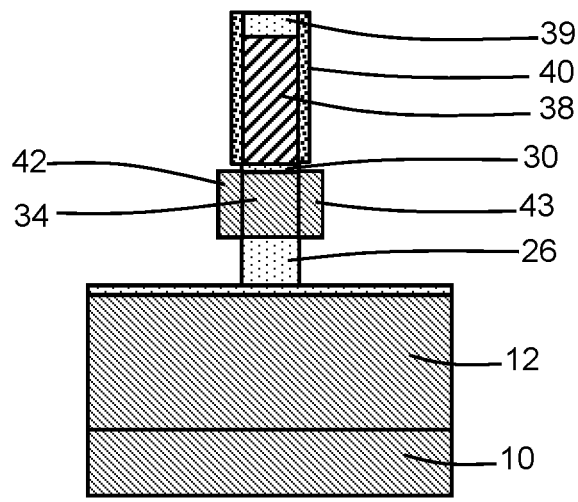
FIG. 8B is a cross-sectional view taken generally along line 8B-8B in FIG. 8.
Figure 8C:
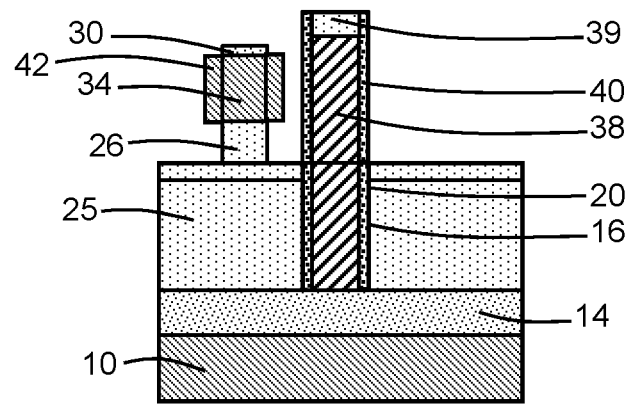
FIG. 8C is a cross-sectional view taken generally along line 8C-8C in FIG. 8.
Figure 9A:
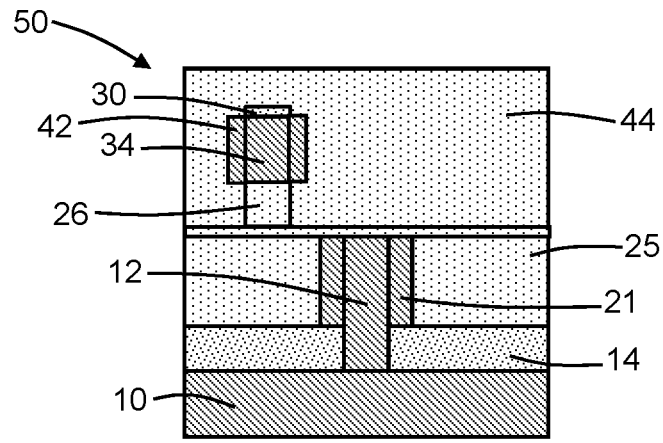
FIGS. 9A, 9B, 9C are cross-sectional views of the structure at a fabrication stage of the processing method subsequent to FIGS. 8A, 8B, 8C.
Figure 9B:
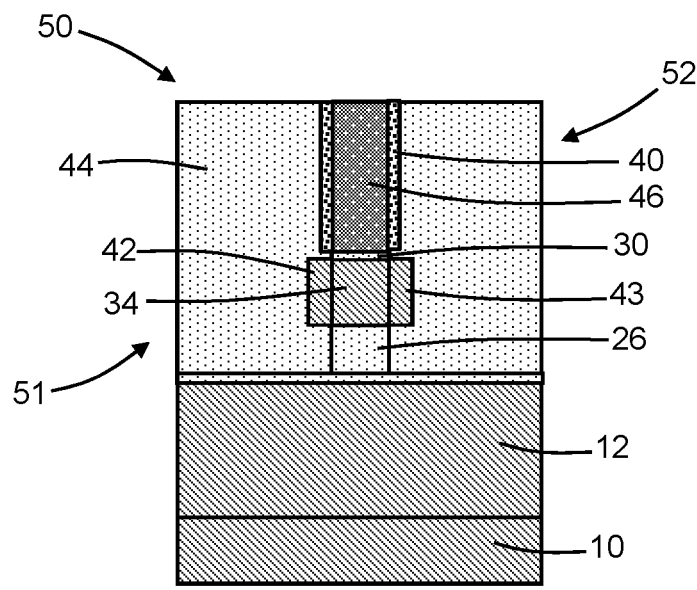
Figure 9C:
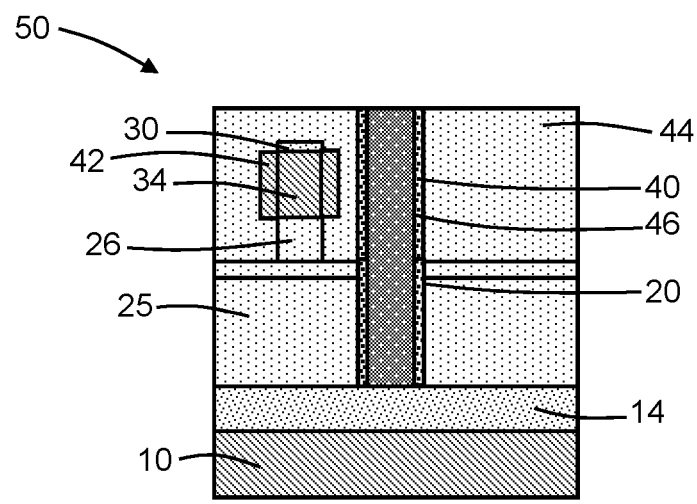

With reference to FIGS. 9A, 9B, 9C in which like reference numerals refer to like features in FIGS. 8A, 8B, 8C and at a subsequent fabrication stage of the processing method, after the source/drain regions 42, 43 are epitaxially grown from the fin 34, a dielectric layer 44 is formed over the fin 12, source/drain regions 42, 43, and sacrificial gate structure 38. The dielectric layer 44 may be composed of a dielectric material, such as silicon dioxide, deposited by a flowable chemical vapor deposition (FCVD) process and planarized by chemical mechanical polishing to have a top surface that is coplanar with the cap 39 on the sacrificial gate structure 38.

A replacement metal gate process is performed that removes the cap 39 and the stacked sacrificial gate structures 16, 38 with an etching process and that subsequently replaces both of the stacked sacrificial gate structures 16, 38 with a gate structure 46 to complete a device structure 50. The gate structure 46 may include a metal gate electrode and a gate dielectric layer arranged between the metal gate electrode and the exterior surfaces of the fins 12, 34. The metal gate electrode of the gate structure 46 may include one or more conformal barrier metal layers and/or work function metal layers, such as layers composed of titanium aluminum carbide and/or titanium nitride, and a metal gate fill layer composed of a conductor, such as tungsten. The gate dielectric layer may be composed of a dielectric material, such as a high-k dielectric like hafnium oxide.

The device structure 50 includes field-effect transistors 51, 52 of complementary conductivity types that are vertically stacked and that share the gate structure 46. The lower field-effect transistor 51 in the device structure 50 includes the fin 12 and the source/drain regions 21, 22, and the upper field-effect transistor 52 in the device structure 50 includes the fin 34 and the source/drain regions 42, 43.

Figure 10:
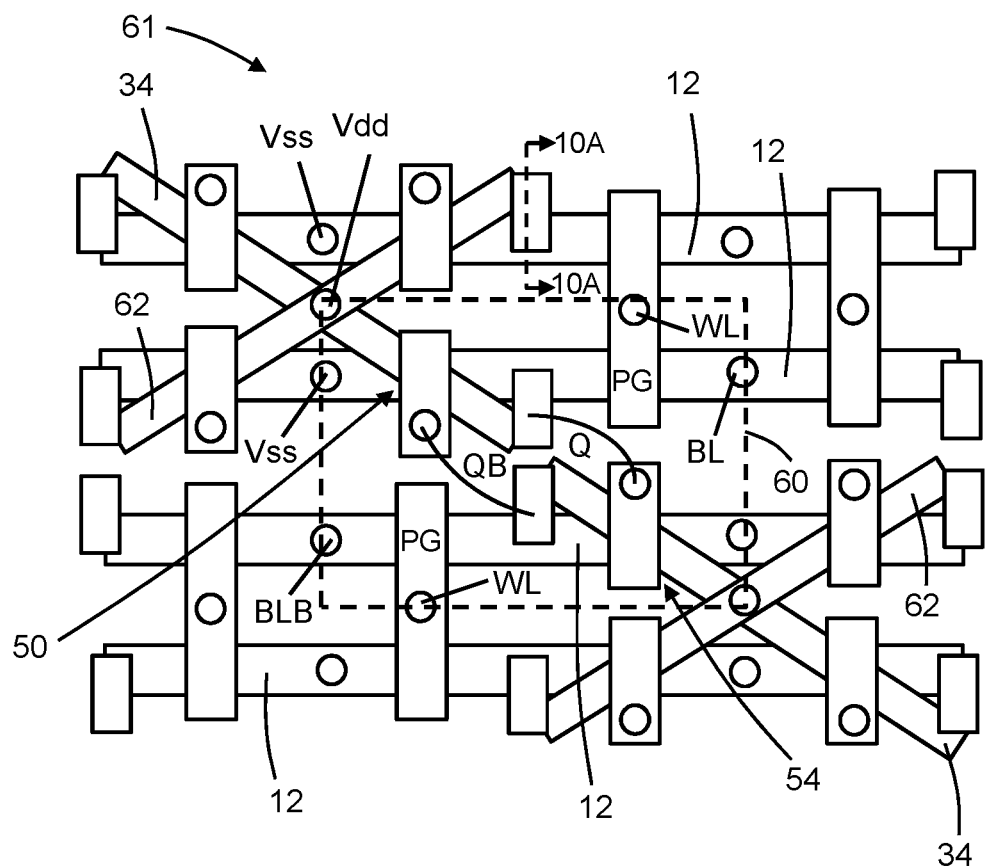
FIG. 10 is a top view of a circuit for 6-transistor SRAM bitcells built using the structure of FIGS. 9A, 9B, 9C in accordance with embodiments of the invention.
Figure 10A:
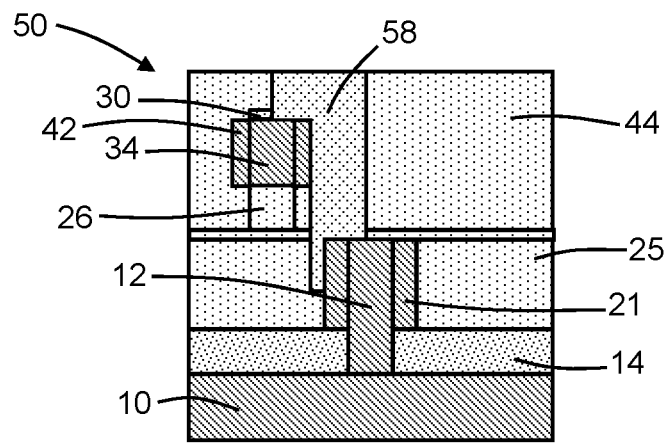
FIG. 10A is a cross-sectional view taken along line 10A-10A in FIG. 10.
Figure 11:
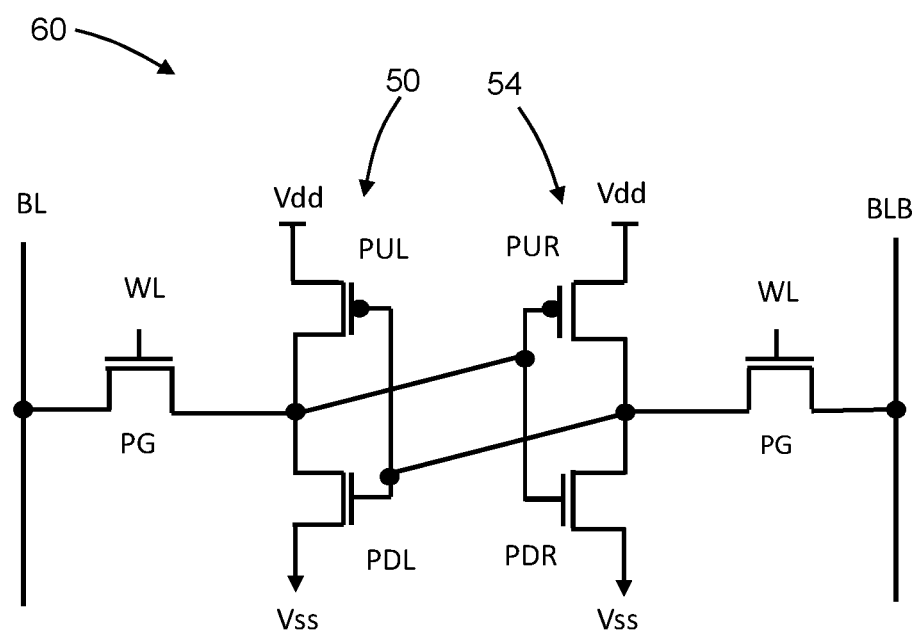
FIG. 11 is a circuit diagram of a 6-transistor SRAM bicell.

With reference to FIGS. 10, 10A, 11 in which like reference numerals refer to like features in FIGS. 9A, 9B, 9C and in accordance with embodiments of the invention, the process forming the device structure 50 may be used to concurrently fabricate additional device structures 54 that are identical to the device structure 50. Each device structure 54 is arranged adjacent to one of the device structures 50 on the substrate 10. Each device structure 54 includes a fin 12 that is diagonally aligned with the fin 12 of the device structure 50. The device structure 54 also includes a fin 34 that is aligned parallel with the fin 34 of the device structure 50. Additional fins 62 are formed when the fins 34 of the device structures 50, 54 are formed. Each of the fins 62 is angled to extend across one of the fins 34. The fins 62 may be formed during the patterning when the semiconductor layer 28 is patterned using the etch mask 32 to define the fins 34.

The device structure 54 includes a gate structure (not shown) that may be formed when the gate structure 46 is formed, and source/drain regions (not shown) of the lower field-effect transistor of the device structure 54 may be grown from fin 12 when the source/drain regions 21, 22 are grown. The gate structure 56 is shared by the upper field-effect transistor 52 and the lower field-effect transistor 51 of the device structure 54. A fin 34 of the upper field-effect transistor of device structure 54 may be formed when the fin 34 of the upper field-effect transistor of device structure 50 is formed, and source/drain regions (not shown) of the upper field-effect transistor 52 of device structure 54 may be epitaxially grown from the fin 34 when the source/drain regions 42, 43 of the upper field-effect transistor 52 of device structure 50 are formed.

The device structures 50, 54 may be used to form a 6-transistor static random access memory (SRAM) bit cell 60 of an SRAM memory device 61. In the representative embodiment of the SRAM bitcell 60, the lower field-effect transistor 51 in each of the device structures 50, 54 may be an n-type field-effect transistor (nFET) and the upper field-effect transistor 52 in each of the device structures 50, 54 may be a p-type field-effect transistor (pFET).

Contacts, as diagrammatically indicated by the filled circles and filled bars in FIG. 10, are formed in the dielectric layer 44 and extend vertically through the dielectric layer 44 to the device structures 50, 54 of the SRAM memory device 61. The contacts may be composed of a conductor, such as a silicide and/or tungsten, and may be arranged in respective contact openings formed by lithography and etching processing in the dielectric layer 44.

Each SRAM bitcell 60 of the SRAM memory device 61 includes pass-gate (PG) field-effect transistors, an inverter that includes a pull-up (PUL) transistor and a pull-down (PDL) transistor that are formed from the stacked field-effect transistors 51, 52 of the device structure 50, and an inverter that includes a pull-up (PUL) transistor and a pull-down (PDL) transistor that are also formed from the stacked field-effect transistors 51, 52 of the device structure 54.

Connections between the fin 12 and the fin 34 are provided by a contact 58, as shown in FIG. 10A.

The gates of the PG field-effect transistors are each connected by one or more contacts with wordlines (WL). The gates of the PG field-effect transistors are each connected by one or more contacts with wordlines (WL). The inverters provided by the device structures have sources and drains that are connected with a negative supply voltage ($V_{SS}$), which may be ground, and a positive supply voltage ($V_{DD}$). The drain of one of the PG field-effect transistors is connected by one or more contacts with a true bit line (BL). The drain of the other of the PG field-effect transistors is connected by one or more contacts with an inverse bit line (BLB). The PG transistors and the WL, BL, and BLB are used to read data from or write data to the bitcell. The $V_{SS}$ line, $V_{DD}$ line, the cross-couples of the gates of the device structures 50, 54, and the connections Q, QB represent wires that are routed in one or more overlying metallization levels of a MOL/BEOL interconnect structure (not shown).

Figure 12:
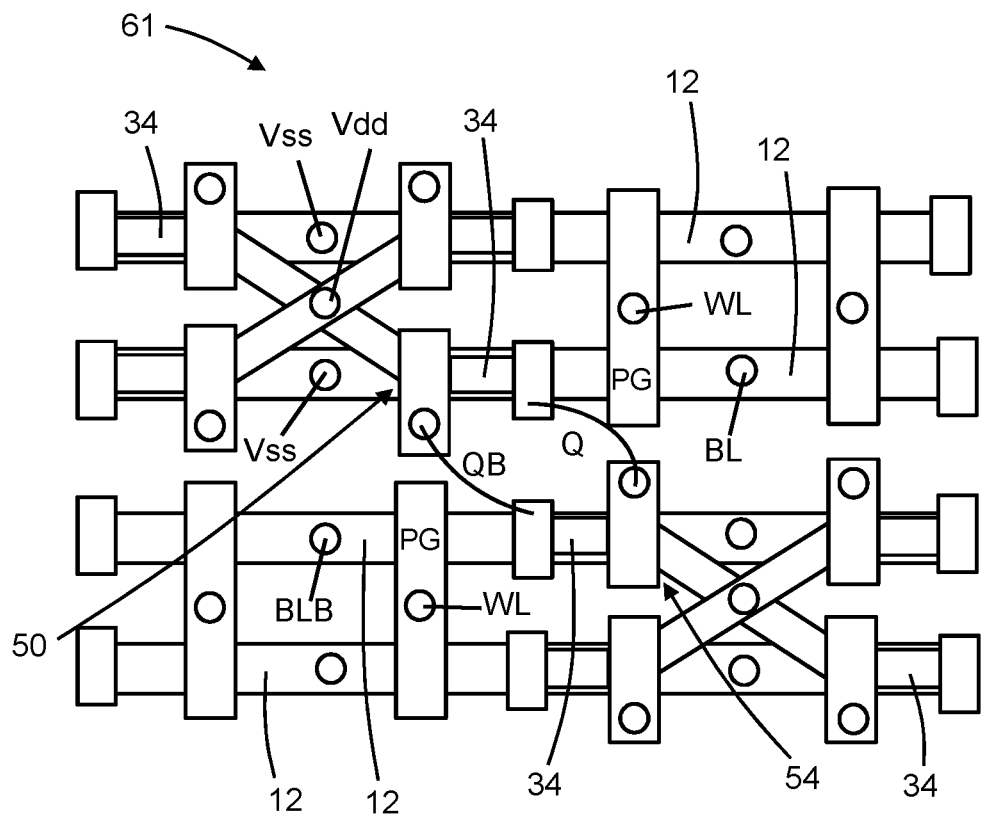
FIG. 12 is a top view of a circuit for 6-transistor SRAM bitcells similar to FIG. 10 in accordance with alternative embodiments of the invention.
Figure 13:
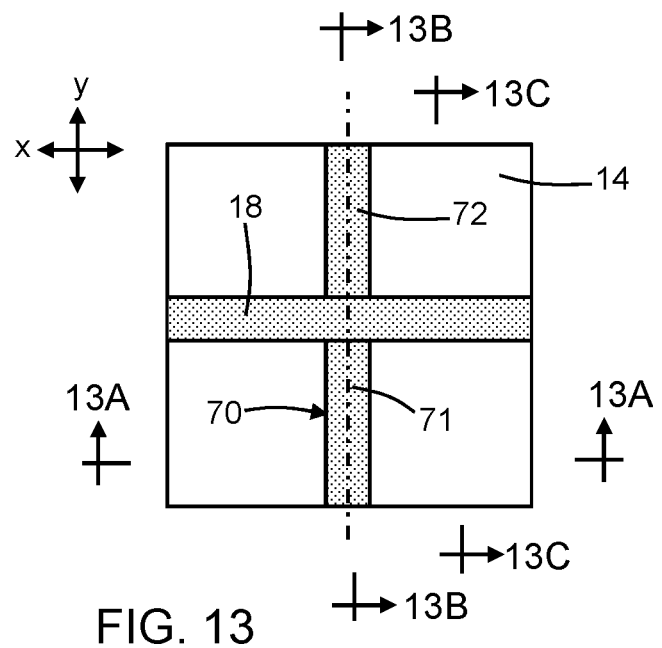
FIG. 13 is a top view of a structure at an initial fabrication stage of a processing method in accordance with embodiments of the invention.
Figure 13A:
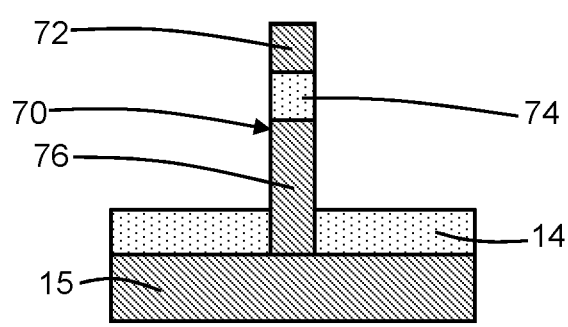
FIG. 13A is a cross-sectional view taken generally along line 13A-13A in FIG. 13.
Figure 13B:
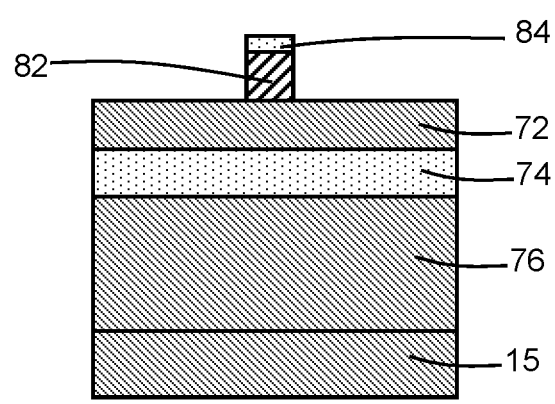
FIG. 13B is a cross-sectional view taken generally along line 13B-13B in FIG. 13.
Figure 13C:
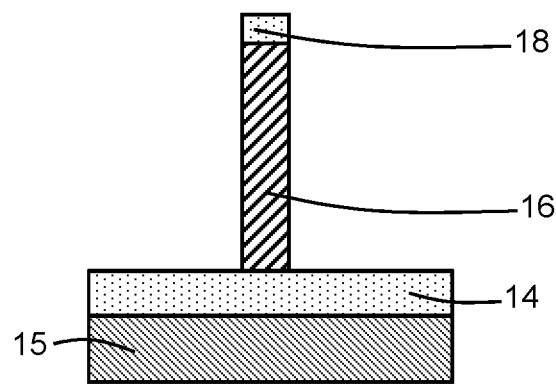
FIG. 13C is a cross-sectional view taken generally along line 13C-13C in FIG. 13.

With reference to FIG. 12 in which like reference numerals refer to like features in FIG. 11 and in accordance with alternative embodiments of the invention, an end of each of the 34 may be re-aligned relative to the fins 12. With the realignment, the ends of the fins 34 are respectively arranged directly over the fins 12.

With reference to FIGS. 13, 14A-C and in accordance with alternative embodiments of the invention, a fin structure 70 is formed by patterning the device layer, buried insulating layer, and substrate of a semiconductor-on-insulator (SOI) wafer. In an embodiment, the SOI substrate may be an extremely thin semiconductor-on-insulator (ETSOI) substrate used to fabricate fully-depleted SOI (FDSOI) device structures. The fin structure 70 includes a fin 72 that includes single-crystal semiconductor material (e.g., single-crystal silicon) from the patterned device layer, a dielectric layer 74 that includes dielectric material (e.g., silicon dioxide) originating from the patterned buried insulator layer, and a fin 76 that includes single-crystal semiconductor material (e.g., single-crystal silicon) from the patterned substrate 15. Each of the fins 72, 74 extends lengthwise along a longitudinal axis 71. The dielectric layer 74 is arranged between the fin 72 and the fin 76. The dielectric layer 14 is formed that surrounds a lower portion of the fin 76 of the fin structure 70. A liner (not shown) composed of, for example, silicon nitride may be arranged between the dielectric layer 14 and the fin 76 and substrate 15. The sacrificial gate structure 16 is formed as a dummy gate that extends across the fin structure 70 and the dielectric layer 14.

Figure 14A:
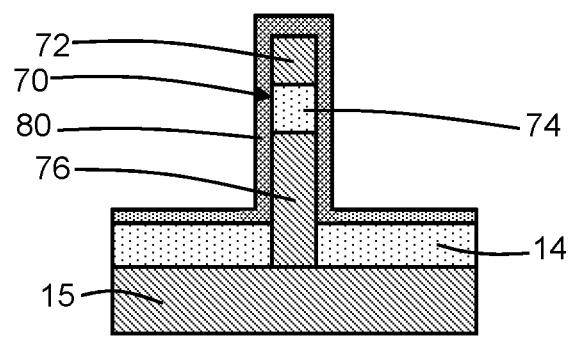
FIGS. 14A, 14B, 14C are cross-sectional views of the structure at a fabrication stage of the processing method subsequent to FIGS. 13A, 13B, 13C.
Figure 14B:
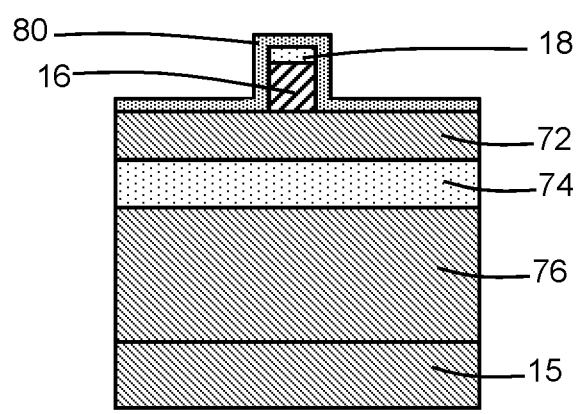
Figure 14C:
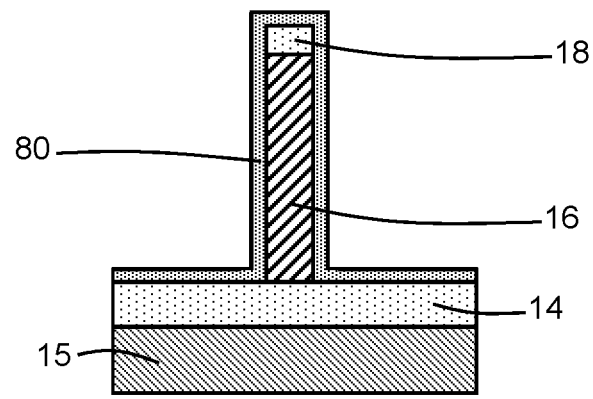
Figure 15A:
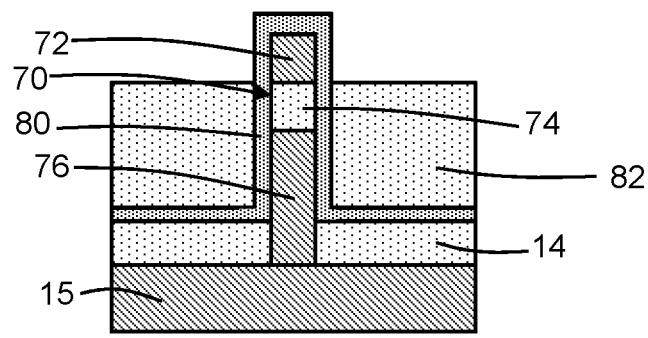
FIGS. 15A, 15B, 15C are cross-sectional views of the structure at a fabrication stage of the processing method subsequent to FIGS. 14A, 14B, 14C.
Figure 15B:
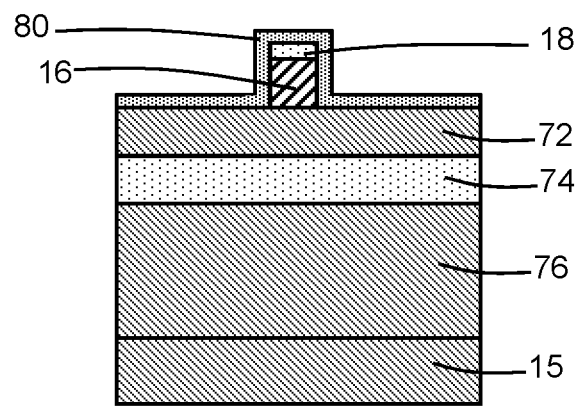
Figure 15C:
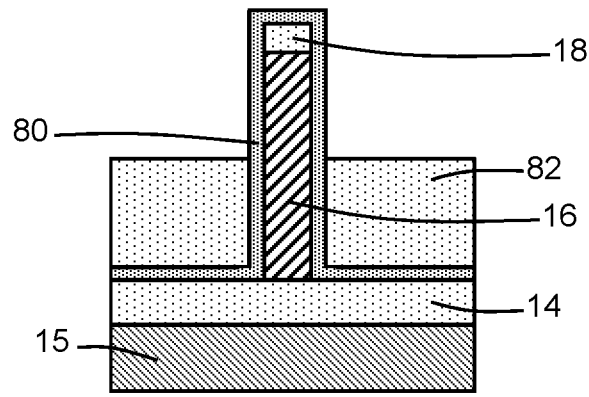

With reference to FIGS. 15A-C in which like reference numerals refer to like features in FIGS. 14A-C and at a subsequent fabrication stage of the processing method, a conformal layer 80 may be applied over the exposed surfaces of the fin structure 70, dielectric layer 14, and sacrificial gate structure 16. The conformal layer 80 may be composed of a dielectric material, such as silicon nitride, deposited by atomic layer deposition.

A dielectric layer 82 composed of a dielectric material, such as silicon dioxide, is deposited and recessed with an etching process. The dielectric layer 82 has a thickness selected to surround and mask the dielectric layer 74 of the fin structure 70 and the portion of the fin 76 of the fin structure 70 that is exposed above the dielectric layer 14. The fin 72 and the section of the conformal layer 80 covering the fin 72 are exposed above an upper surface of the dielectric layer 82. In an embodiment, the dielectric layer 82 may be recessed to be coplanar with the upper surface of the dielectric layer 74.

Figure 16A:
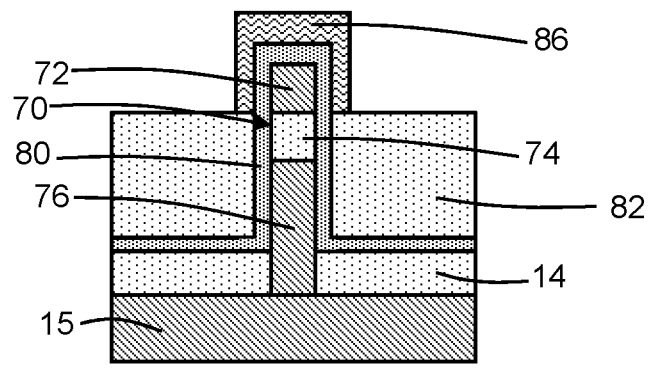
FIGS. 16A, 16B, 16C are cross-sectional views of the structure at a fabrication stage of the processing method subsequent to FIGS. 15A, 15B, 15C.
Figure 16B:
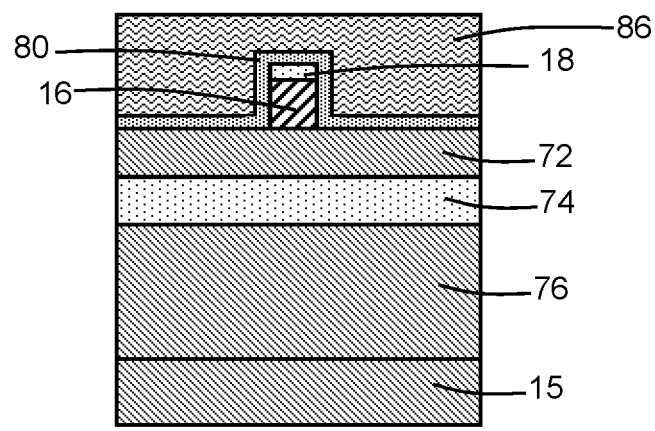
Figure 16C:
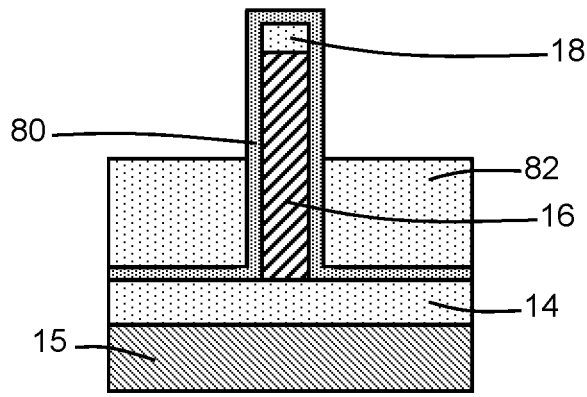

With reference to FIGS. 16A-C in which like reference numerals refer to like features in FIGS. 15A-C and at a subsequent fabrication stage of the processing method, an etch mask 86 is formed that covers the fin 72 and the section of the conformal layer 80 on the fin 72. The etch mask 86 may be formed by patterning a deposited layer of an organic planarization layer (OPL) material or a spin-on hardmask with lithography and etching processes. Over the fin structure 70, the width of the etch mask 86 is greater than the width of the fin structure 70 to provide a margin at the edges ensuring fully coverage and masking of the fin structure 70 during the subsequent etching process and surface modification process.

Figure 17A:
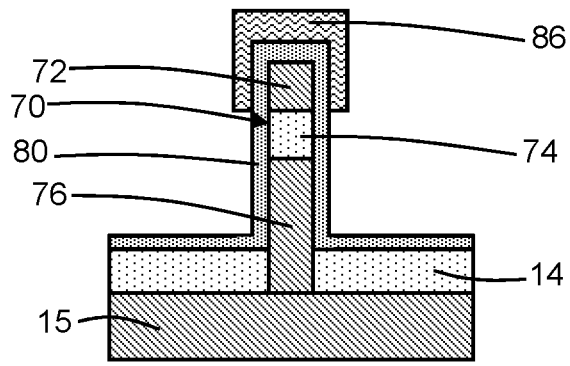
FIGS. 17A, 17B, 17C are cross-sectional views of the structure at a fabrication stage of the processing method subsequent to FIGS. 16A, 16B, 16C.
Figure 17B:
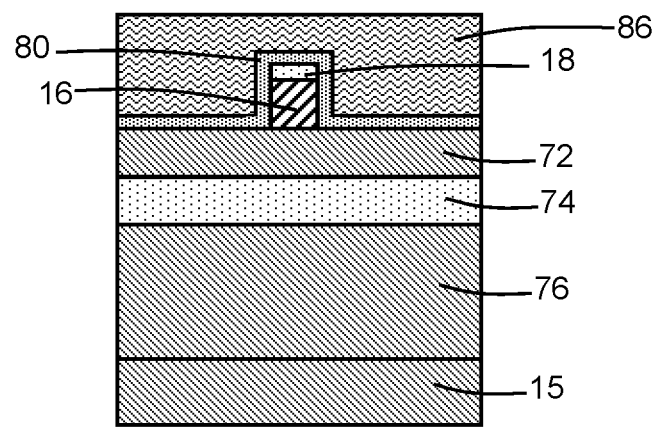
Figure 17C:
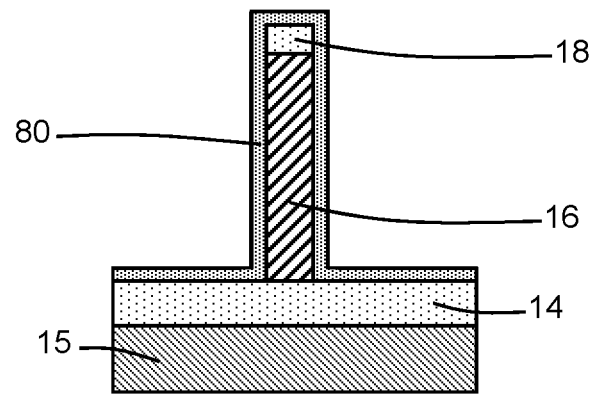

With reference to FIGS. 17A-C in which like reference numerals refer to like features in FIGS. 16A-C and at a subsequent fabrication stage of the processing method, unmasked portions of the dielectric layer 82 are removed with an etching process, such as a wet chemical etching process. The conformal dielectric layer 80 operates as an etch stop during the etching process, and a portion of the conformal dielectric layer 80 on the fin structure 70 below the fin 72 is exposed. The fin 72 is covered by the etch mask 86.

Figure 18A:
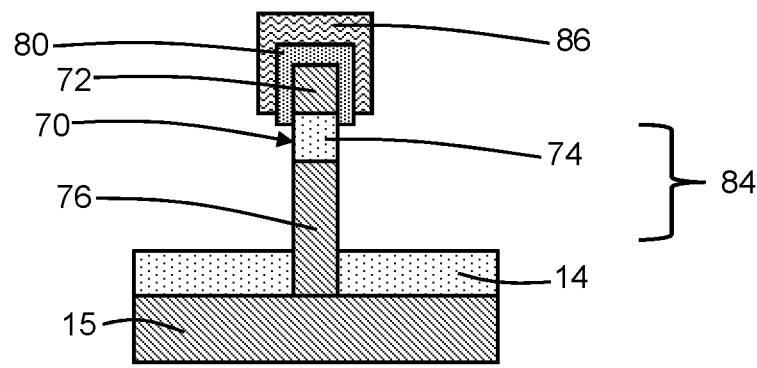
FIGS. 18A, 18B, 18C are cross-sectional views of the structure at a fabrication stage of the processing method subsequent to FIGS. 17A, 17B, 17C.
Figure 18B:
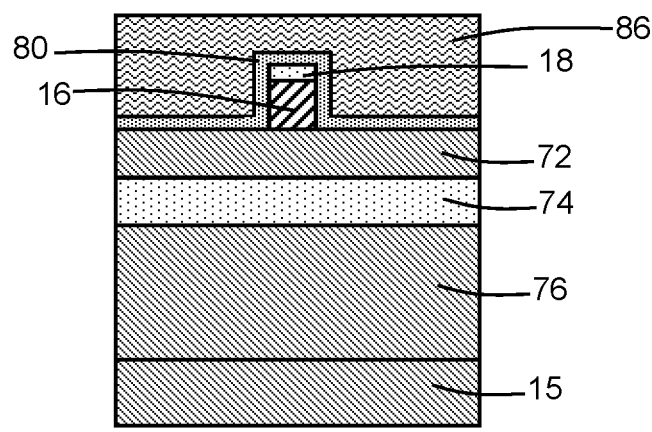
Figure 18C:
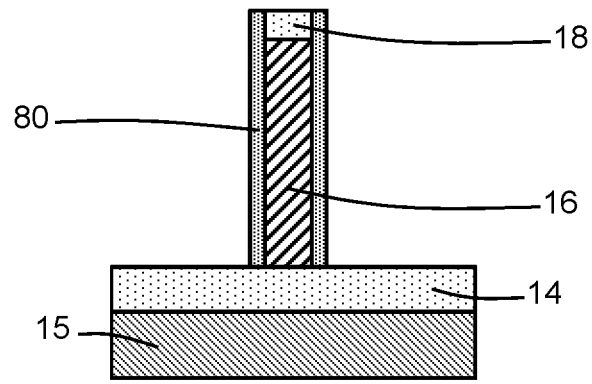

With reference to FIGS. 18A-C in which like reference numerals refer to like features in FIGS. 17A-C and at a subsequent fabrication stage of the processing method, a section 84 of the conformal dielectric layer 80 is removed from the portion of the fin 76 exposed above the dielectric layer 14, as well as from at least a portion of the dielectric layer 74 and over the sacrificial gate structure 16. The section 84 of the conformal dielectric layer 80 may be removed by, for example, using a surface modification technique to modify the conformal layer 80. In an embodiment, the dielectric material in the section of the conformal dielectric layer 80 below the etch mask 86 may be damaged with ion implantation performed under a given set of implantation conditions, such as ion species (e.g., hydrogen ions), dose, kinetic energy, tilt angle, and the damaged dielectric material may be removed with a wet chemical etching process, such as with a solution containing dilute hydrofluoric acid. The removal of the section of the section of the conformal dielectric layer 80 from the fin structure 70 exposes the exterior surfaces of the fin 76 for subsequent processing. The section of the conformal dielectric layer 80 on the fin 72 is covered by the etch mask 86 during the etching process and preserved.

The conformal layer 80 located on the sidewalls of the sacrificial gate structure 16 is not removed by the etching process. To that end, the tilt angle of the implantation may be adjusted to be oriented parallel to the sacrificial gate structure 16 (i.e., perpendicular to the fin structure 70) such that sections of the conformal layer 80 located on the sidewalls of the sacrificial gate structure 16 are not implanted with ions and, therefore, not susceptible to removal by the etching process. These unmodified sections of the conformal layer 80 mask the sacrificial gate structure 16 during the etching process.

Figure 19A:
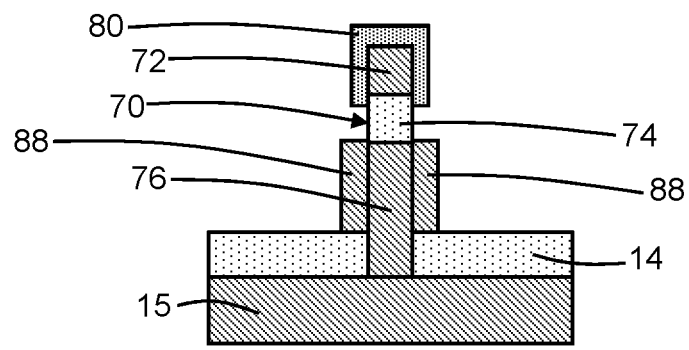
FIGS. 19A, 19B, 19C are cross-sectional views of the structure at a fabrication stage of the processing method subsequent to FIGS. 18A, 18B, 18C.
Figure 19B:
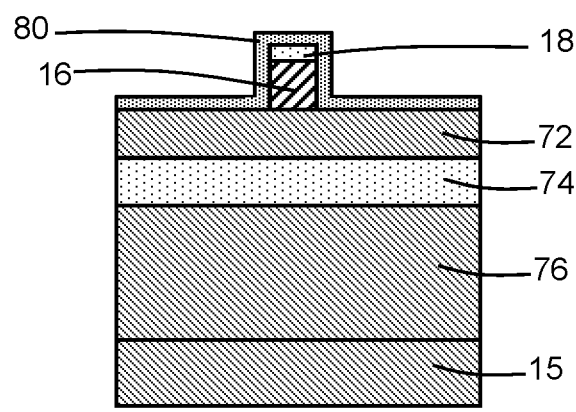
Figure 19C:
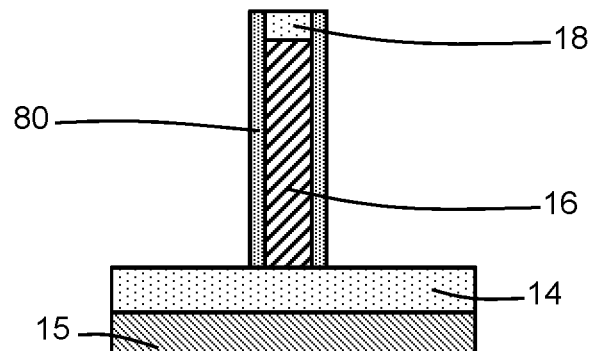

With reference to FIGS. 19A-C in which like reference numerals refer to like features in FIGS. 18A-C and at a subsequent fabrication stage of the processing method, the etch mask 86 is removed from the fin 72. The fin 72 is covered by the conformal dielectric layer 80. Semiconductor layers 88 are grown by an epitaxial growth process from the sidewalls of the fin 76, and may contain, for example, a concentration of an n-type dopant (e.g., phosphorus and/or arsenic) that provides n-type electrical conductivity. The semiconductor material contained in the semiconductor layers 88 may be composed of silicon or silicon-germanium. The epitaxial growth process may be selective such that the semiconductor material does not nucleate and grow form the dielectric layer 74 of the fin structure 70 or from the conformal dielectric layer 80. The fin 76 is arranged between one of the semiconductor layers 88 and the other of the semiconductor layers 88. The epitaxial semiconductor layers 88 provide source/drain regions.

Figure 20A:
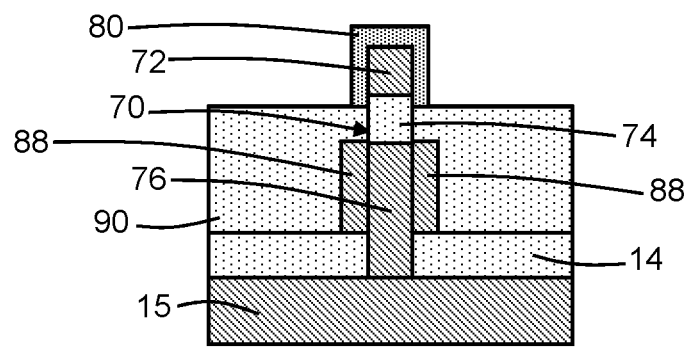
FIGS. 20A, 20B, 20C are cross-sectional views of the structure at a fabrication stage of the processing method subsequent to FIGS. 19A, 19B, 19C.
Figure 20B:
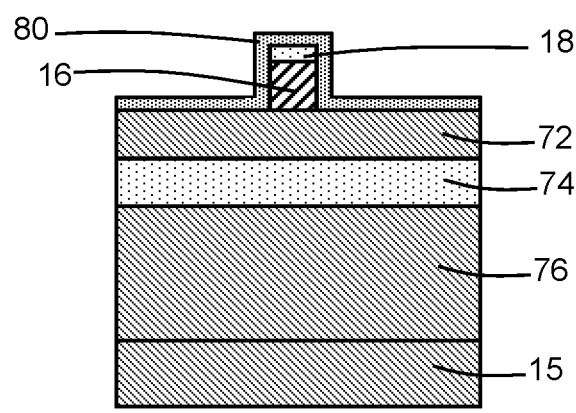
Figure 20C:
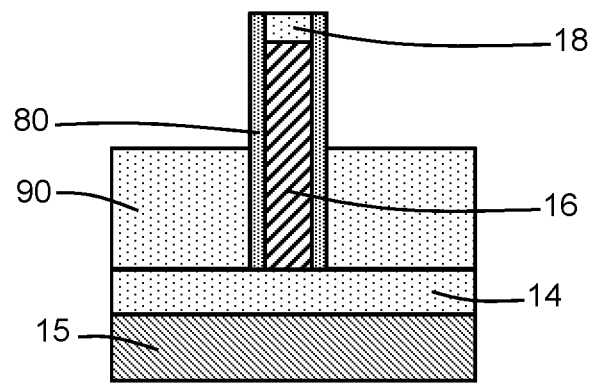

With reference to FIGS. 20A-C in which like reference numerals refer to like features in FIGS. 19A-C and at a subsequent fabrication stage of the processing method, a dielectric layer 90 composed of a dielectric material, such as silicon dioxide, is deposited and recessed with an etching process. The dielectric layer 90 has a thickness selected to surround and mask the sections of the epitaxial semiconductor layers 88 and the dielectric layer 74 of the fin structure 70. The fin 72 and the section of the conformal layer 80 covering the fin 72 are exposed above an upper surface of the dielectric layer 90.

Figure 21A:
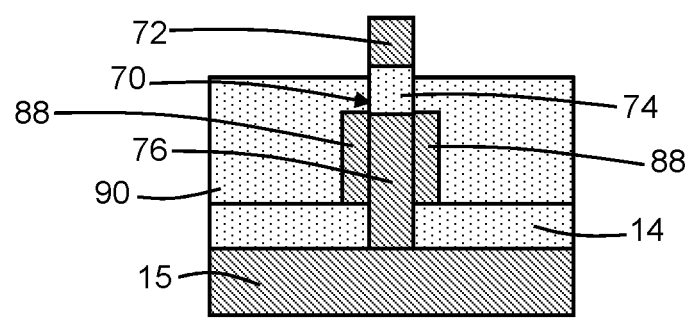
FIGS. 21A, 21B, 21C are cross-sectional views of the structure at a fabrication stage of the processing method subsequent to FIGS. 20A, 20B, 20C.
Figure 21B:
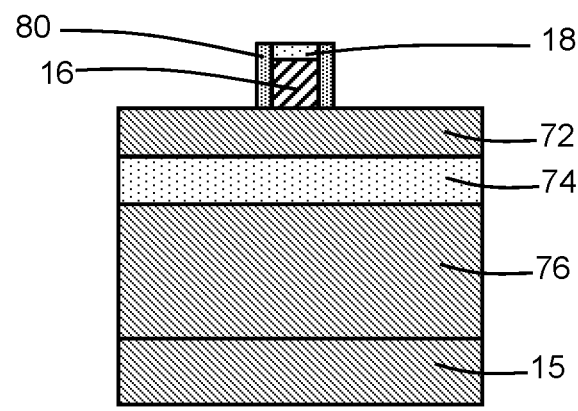
Figure 21C:
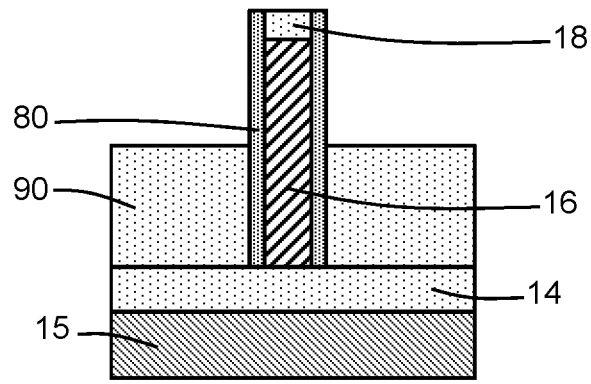

With reference to FIGS. 21A-C in which like reference numerals refer to like features in FIGS. 20A-C and at a subsequent fabrication stage of the processing method, the section of the conformal dielectric layer 80 is removed from the fin 72. The section 84 of the conformal dielectric layer 80 may be removed by, for example, using a surface modification technique to modify the conformal layer 80. In an embodiment, the dielectric material in the section of the conformal dielectric layer 80 may be damaged with ion implantation performed under a given set of implantation conditions, such as ion species (e.g., hydrogen ions), dose, kinetic energy, tilt angle, and the damaged dielectric material may be removed with a wet chemical etching process, such as with a solution containing dilute hydrofluoric acid. The removal of the section of the section of the conformal dielectric layer 80 from the fin structure 70 exposes the exterior surfaces of the fin 76 for subsequent processing. The the epitaxial semiconductor layers 88 are covered by the recessed dielectric layer 90 during the etching process and preserved.

The conformal layer 80 located on the sidewalls of the sacrificial gate structure 16 is not removed by the etching process. To that end, the tilt angle of the implantation may be adjusted to be oriented parallel to the sacrificial gate structure 16 (i.e., perpendicular to the fin structure 70) such that sections of the conformal layer 80 located on the sidewalls of the sacrificial gate structure 16 are not implanted with ions and, therefore, not susceptible to removal by the etching process. These unmodified sections of the conformal layer 80 mask the sacrificial gate structure 16 during the etching process.

With reference to FIGS. 22, 22A-C in which like reference numerals refer to like features in FIGS. 21, 21A-C and at a subsequent fabrication stage of the processing method, a semiconductor layer 92 is grown by an epitaxial growth process from the sidewalls of the fin 72, and may contain, for example, a concentration of a p-type dopant (e.g., boron) that provides p-type electrical conductivity. The semiconductor material contained in the semiconductor layer 92 may be composed of silicon or silicon-germanium. The epitaxial growth process may be selective such that the semiconductor material does not nucleate and grow form the dielectric layer 90 or from the conformal dielectric layer 80. The extent of lateral epitaxial growth of the semiconductor layer 92 is greater than that of the semiconductor layers 88.

Figure 22A:
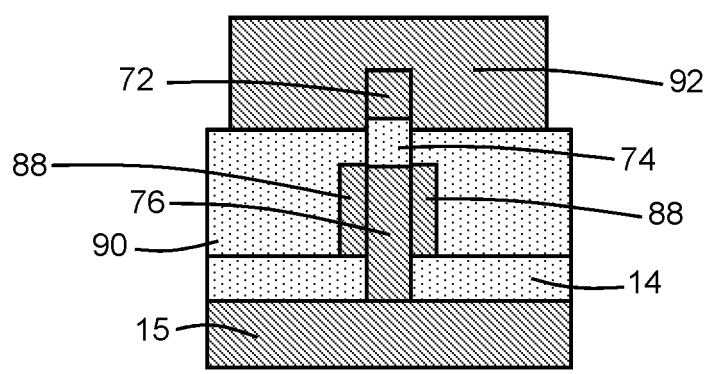
FIGS. 22A, 22B, 22C are cross-sectional views of the structure at a fabrication stage of the processing method subsequent to FIGS. 21A, 21B, 21C.
Figure 22B:
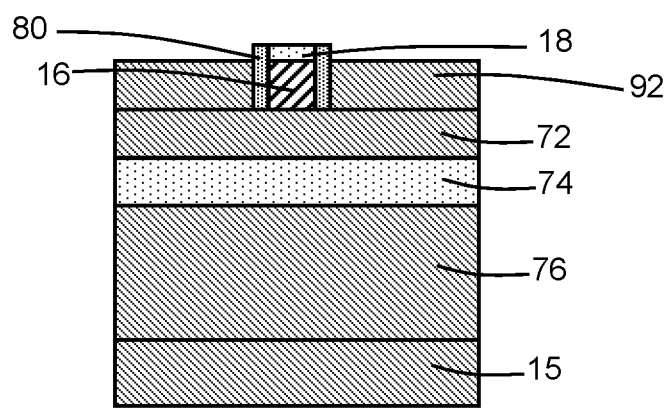
Figure 22C:
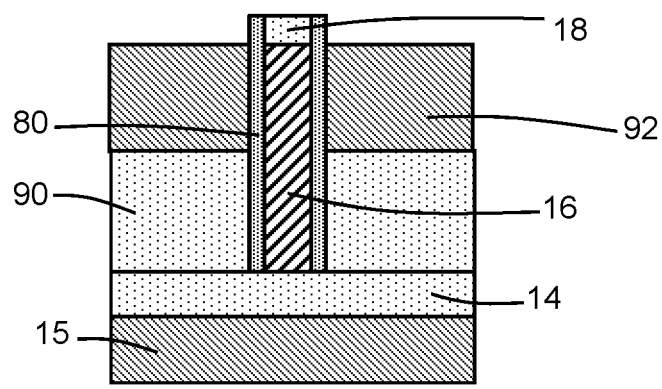
Figure 23:
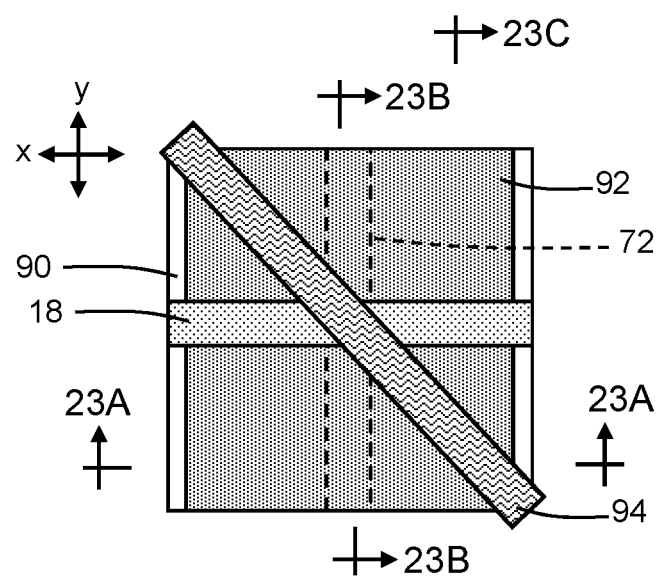
FIG. 23 is a top view showing a structure at a fabrication stage of the processing method subsequent to the fabrication stage of FIGS. 22A, 22B, 22C.
Figure 23A:
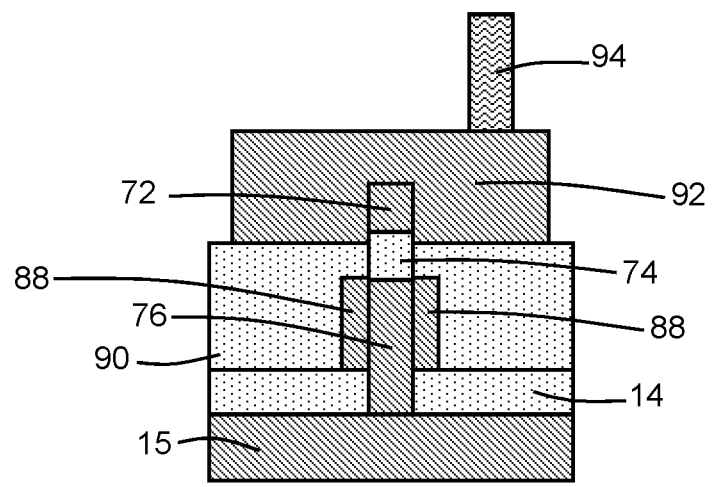
FIG. 23A is a cross-sectional view taken generally along line 23A-23A in FIG. 23.
Figure 23B:
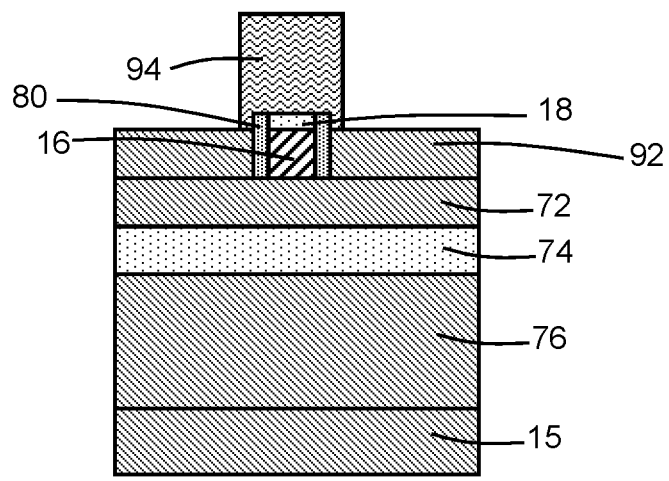
FIG. 23B is a cross-sectional view taken generally along line 23B-23B in FIG. 23.
Figure 23C:
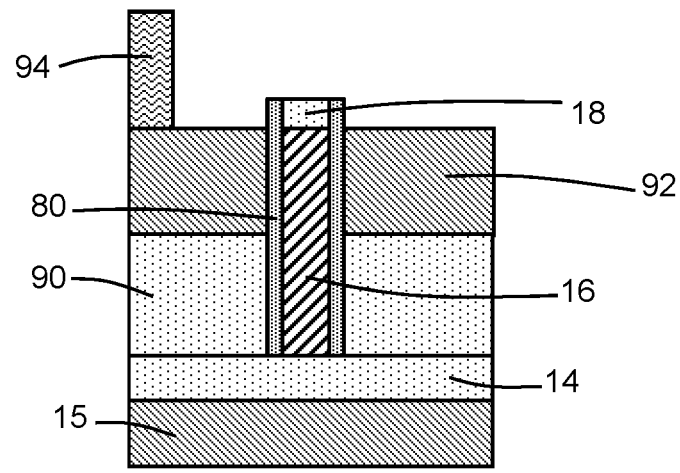
FIG. 23C is a cross-sectional view taken generally along line 23C-23C in FIG. 23.
Figure 24:
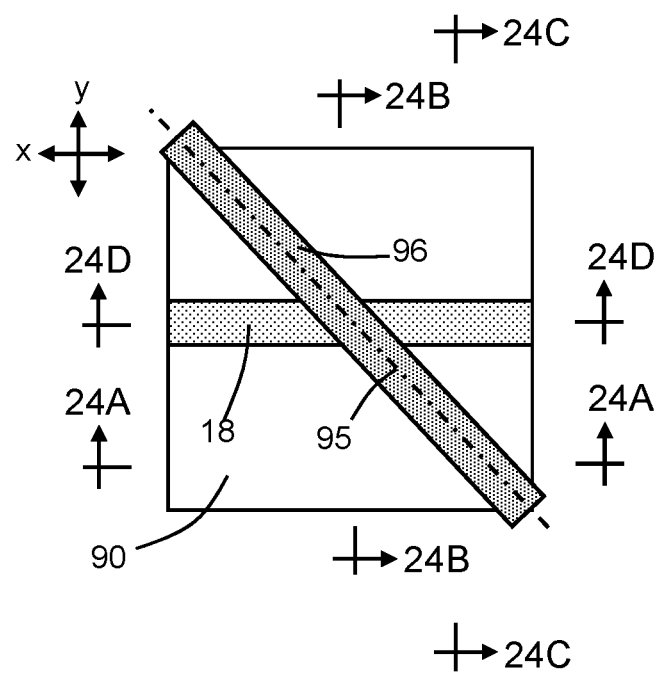
FIG. 24 is a top view showing a structure at a fabrication stage of the processing method subsequent to the fabrication stage of FIGS. 23A, 23B, 23C.
Figure 24A:
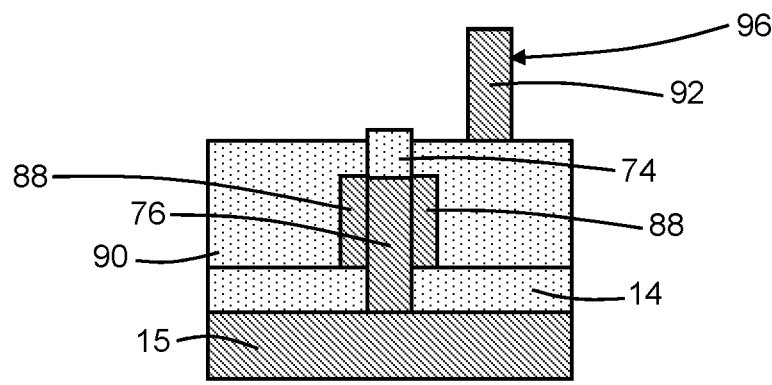
FIG. 24A is a cross-sectional view taken generally along line 24A-24A in FIG. 24.
Figure 24B:
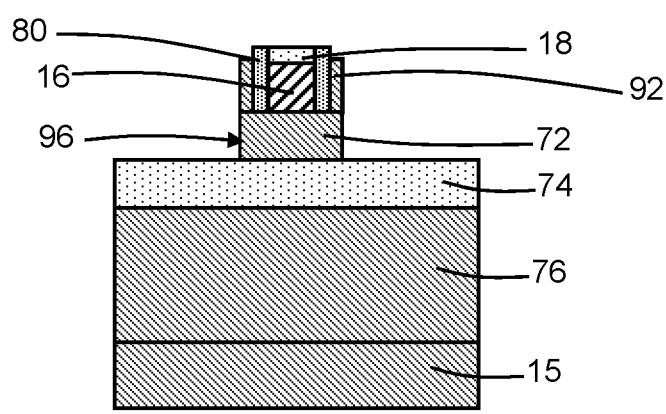
FIG. 24B is a cross-sectional view taken generally along line 24B-24B in FIG. 24.
Figure 24C:
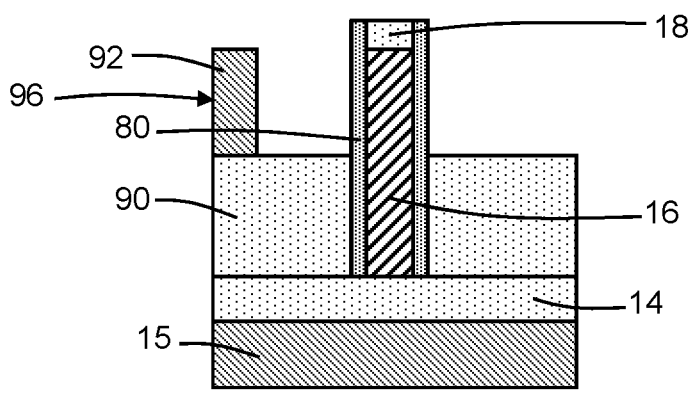
FIG. 24C is a cross-sectional view taken generally along line 24C-24C in FIG. 24.
Figure 24D:
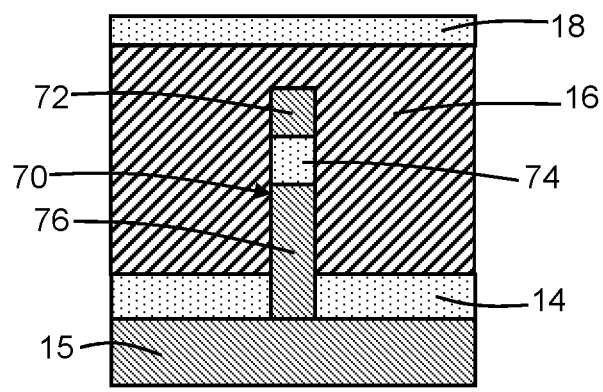
FIG. 24D is a cross-sectional view taken generally along line 24D-24D in FIG. 24.
Figure 25A:
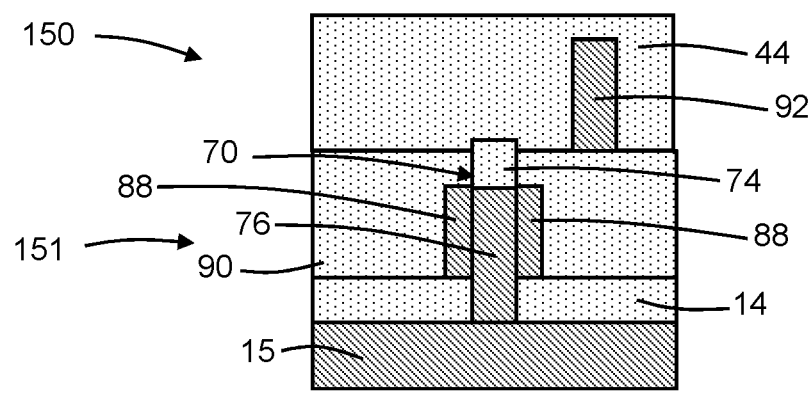
FIGS. 25A, 25B, 25C, 25D are cross-sectional views of the structure at a fabrication stage of the processing method respectively subsequent to FIGS. 24A, 24B, 24C, 24D.
Figure 25B:
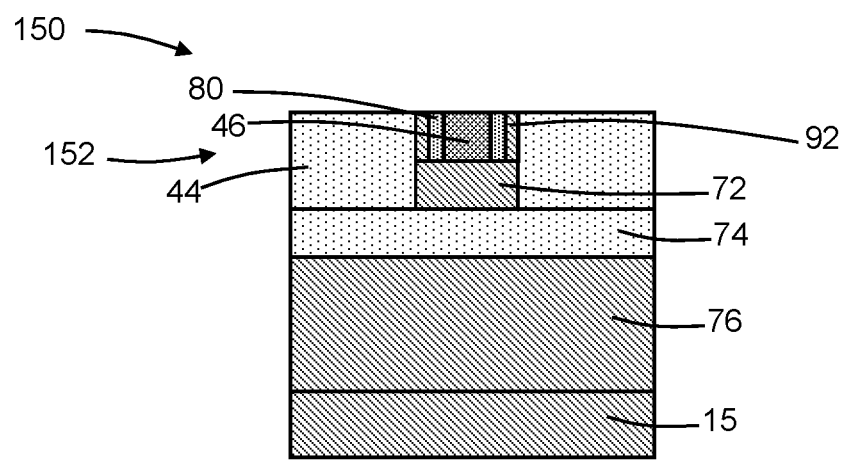
Figure 25C:
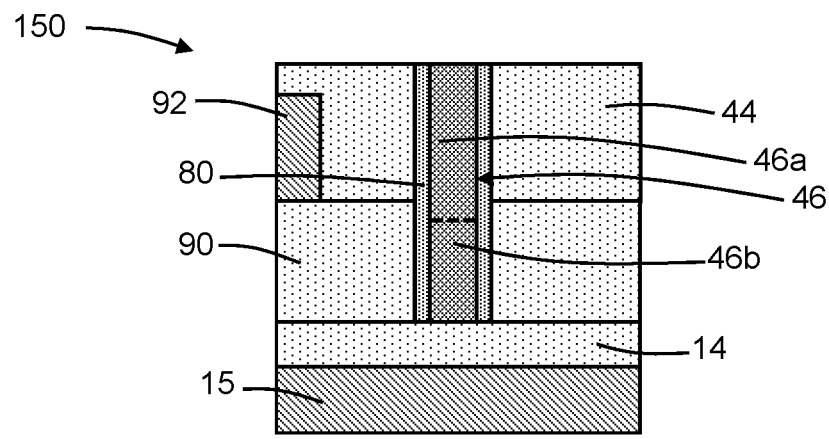
Figure 25D:
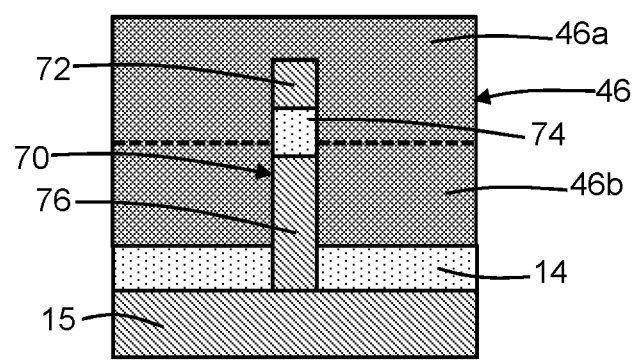

With reference to FIGS. 23, 23A-D in which like reference numerals refer to like features in FIGS. 22A-C and at a subsequent fabrication stage of the processing method, an etch mask 94 may be comprised of a layer of a light-sensitive material, such as an organic photoresist, applied by a spin coating process, pre-baked, exposed to light projected through a photomask, baked after exposure, and developed with a chemical developer. The etch mask 94 may also include an anti-reflective coating and a spin-on hardmask, such as an organic planarization layer (OPL), that are patterned along with the photoresist. The etch mask 94 covers a strip over the epitaxial semiconductor layer 92, and the fin 72 and the etch mask 94 have a longitudinal axis 73 that is inclined at an angle (i.e., rotated) relative to a longitudinal axis extending along the length of the fin 76.

With reference to FIGS. 24, 24A-C in which like reference numerals refer to like features in FIGS. 23, 23A-C and at a subsequent fabrication stage of the processing method, the fin 72 and the epitaxial semiconductor layer 92 are etched with the etch mask 94 arranged over the fin 72 and epitaxial semiconductor layer 92. The etching process may be a reactive ion etching process, and the etch mask 94 is removed following the etching process. The epitaxial semiconductor layer 92 masked by the etch mask are shaped into a strip that intersects the masked portion of the fin 72 that remains after etching. Portions of the epitaxial semiconductor layer 92 are arranged on opposite sides of the sacrificial gate structure 16.

The etched semiconductor layer 92 and masked portion of the fin 72 define another fin 96 that has a longitudinal axis 95 that is inclined at an angle (i.e., rotated) relative to the longitudinal axis 71 extending along the length of the fin 76. The different sections of the epitaxial semiconductor layer 92 provide source/drain regions of the fin 96. The sections of the semiconductor layer 92 and the fin 72 have a linear arrangement with the fin 72 arranged between the different sections of the semiconductor layer 92, and the linear arrangement forming the fin 96 has a longitudinal axis that is aligned at an angle relative to the longitudinal axis extending along the length of the lower fin 76.

With reference to FIGS. 25A-D in which like reference numerals refer to like features in FIGS. 24A-D and at a subsequent fabrication stage of the processing method, the dielectric layer 44 is formed and a replacement metal gate process is performed to replace the cap 18 and sacrificial gate structure 16 with the gate structure 46 to complete a device structure 150. The different sections of the conformal layer 80 provide sidewall spacers between which the gate structure 46 is arranged.

The device structure 150 includes the field-effect transistors 151, 152 of complementary conductivity types that are vertically stacked and that share the gate structure 46. The lower field-effect transistor 151 in the device structure 150 includes the fin 76 and the source/drain regions provided by the epitaxial semiconductor layers 88, and the upper field-effect transistor 152 in the device structure 150 includes the fin 96, which includes the portion of the fin 72 and the source/drain regions provided by the sections of the epitaxial semiconductor layer 92. The gate structure 46 may include a metal gate electrode that has layers 46a, 46b composed of different work function metals associated with the different field-effect transistors 151, 152. The layers 46a, 46b may be sequentially deposited by atomic layer deposition or chemical vapor deposition in the space opened by the removal of the sacrificial gate structure 16.

The field-effect transistors 151, 152 of the device structure 150 may be used to construct the embodiments of the SRAM bit cell 60 and SRAM memory device 61 shown in FIGS. 11, 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a static random access memory device, the structure comprising:
   a first bitcell including a first fin, a second fin arranged over the first fin, a first dielectric layer between the first fin and the second fin, a third fin, a fourth fin arranged over the third fin, a second dielectric layer between the third fin and the fourth fin, a first inverter, and a second inverter, the first inverter including a first field-effect transistor with a channel region in the first fin and a second field-effect transistor with a channel region in the second fin, the first field-effect transistor and the second field-effect transistor sharing a first gate structure having an overlapping arrangement with the channel region in the first fin and the channel region in the second fin, the first fin having a longitudinal axis, and the second fin having a longitudinal axis that is aligned at a first angle relative to the longitudinal axis of the first fin, and the second inverter including a third field-effect transistor with a channel region in the third fin and a fourth field-effect transistor with a channel region in the fourth fin, the third field-effect transistor and the fourth field-effect transistor sharing a second gate structure having an overlapping arrangement with the channel region in the third fin and the channel region in the fourth fin, the third fin having a longitudinal axis, and the fourth fin having a longitudinal axis that is aligned at a second angle relative to the longitudinal axis of the third fin.

2. The structure of claim 1 wherein the longitudinal axis of the first fin is aligned substantially parallel to the longitudinal axis of the third fin, and the longitudinal axis of the second fin is aligned substantially collinear with the longitudinal axis of the fourth fin.

3. The structure of claim 1 wherein the first bitcell further includes a first pass-gate transistor having a channel region in the first fin, and a second pass-gate transistor having a channel region in the third fin.

4. The structure of claim 1 further comprising:
   a second bit cell including a fifth fin, a sixth fin arranged over the fifth fin, a third dielectric layer between the fifth fin and the sixth fin, and a third inverter, the third inverter including a fifth field-effect transistor with a channel region in the fifth fin and a sixth field-effect transistor with a channel region in the sixth fin, the fifth field-effect transistor and the sixth field-effect transistor sharing a third gate structure having an overlapping arrangement with the channel region in the fifth fin and the channel region in the sixth fin, the fifth fin having a longitudinal axis, the sixth fin having a longitudinal axis that is aligned at a third angle relative to the longitudinal axis of the fifth fin, the longitudinal axis of the first fin aligned substantially parallel to the longitudinal axis of the fifth fin, and the sixth fin intersecting the second fin at a location laterally between the first fin and the fifth fin.

5. The structure of claim 4 further comprising:
   a contact connected with the second fin and the sixth fin at the location,
   wherein the contact is configured to couple the second fin and the sixth fin with a supply voltage.

6. The structure of claim 1 further comprising:
   a second bit cell including a fifth fin arranged over the first fin, a third dielectric layer between the fifth fin and the first fin, and a third inverter, the third inverter including a fifth field-effect transistor with a channel region in the first fin and a sixth field-effect transistor with a channel region in the fifth fin, the fifth field-effect transistor and the sixth field-effect transistor sharing a third gate structure having an overlapping arrangement with the channel region in the first fin and the channel region in the fifth fin, the fifth fin a longitudinal axis that is aligned at a third angle relative to the longitudinal axis of the first fin, and the fifth fin intersecting the second fin at a location.

7. The structure of claim 6 further comprising:
   a contact connected with the second fin and the fifth fin at the location,
   wherein the contact is configured to couple the second fin and the fifth fin with a supply voltage.

8. A structure comprising:
a first field-effect transistor including a first fin, a first source/drain region, and a second source/drain region;
a second field-effect transistor including a second fin arranged under the first fin, a third source/drain region, and a fourth source/drain region; and
a gate structure shared by the first field-effect transistor and the second field-effect transistor, the gate structure including a gate electrode with a first section having a first overlapping arrangement with a section of the first fin and a second section having a second overlapping arrangement with a section of the second fin, and the second section of the gate electrode is stacked with the first section of the gate electrode,
wherein the first fin includes a portion of a device layer of a semiconductor-on-insulator substrate, the second fin is a portion of a substrate of the semiconductor-on-insulator substrate, the first section of the gate electrode includes a first work function metal, and the second section of the gate electrode includes a second work function metal different in composition from the first work function metal.

9. The structure of claim 8 wherein the first fin, the first source/drain region, and the second source/drain region have a linear arrangement with the first fin arranged between the first source/drain region, and the second source/drain region, the second fin has a longitudinal axis, and the linear arrangement has a longitudinal axis aligned at an angle relative to the longitudinal axis of the second fin.

10. The structure of claim 8 wherein the first source/drain region and the second source/drain region are comprised of semiconductor material having a first conductivity type, and the third source/drain region and the fourth source/drain region are comprised of semiconductor material having a second conductivity type opposite from the first conductivity type.

11. The structure of claim 8 wherein the section of the first fin is arranged directly over the section of the second fin.

12. The structure of claim 8 further comprising:
a dielectric layer arranged in a vertical direction between the first fin and the second fin,
wherein the dielectric layer is a portion of a buried insulator layer of the semiconductor-on-insulator substrate.

13. A method comprising:
patterning a device layer and a substrate of a semiconductor-on-insulator substrate to respectively define a first fin and a second fin arranged under the first fin;
epitaxially growing a first semiconductor material from the first fin; and
patterning the first semiconductor material and the first fin to form a first source/drain region and a second source drain region having a linear arrangement with a section of the first fin,
wherein the first semiconductor material and the first fin are patterned such that the linear arrangement has a longitudinal axis that is aligned at an angle relative to a longitudinal axis of the second fin.

14. The method of claim 13 further comprising:
forming a sacrificial gate structure that overlaps with the section of the first fin and a section of the second fin.

15. The method of claim 14 further comprising:
after patterning the first semiconductor material and the first fin, removing the sacrificial gate structure; and
forming a gate electrode having a first section and a second section stacked with the first section in a space opened by removal of the sacrificial gate structure,
wherein the section of the first fin is arranged directly over the section of the second fin, the first section of the gate electrode includes a first work function metal, and the second section of the gate electrode includes a second work function metal that is different in composition from the first work function metal.

16. The method of claim 13 further comprising:
forming a conformal layer over the first fin and the second fin;
masking the first fin and a first section of the conformal layer on the first fin with an etch mask; and
removing a second section of the conformal layer from the second fin while the first section of the conformal layer on the first fin is masked by the etch mask; and
epitaxially growing a second semiconductor material from surfaces of the second fin exposed by removing the second section of the conformal layer.

17. The method of claim 16 further comprising:
removing the etch mask from the first fin; and
removing the first section of the conformal layer from the first fin,
wherein the first semiconductor material is epitaxially grown from surfaces of the first fin exposed by removing the first section of the conformal layer.

* * * * *